(12) United States Patent
Pan et al.

(10) Patent No.: US 10,573,394 B2
(45) Date of Patent: Feb. 25, 2020

(54) MEMORY SYSTEM

(71) Applicant: Toshiba Memory Corporation, Tokyo (JP)

(72) Inventors: Jialin Pan, Kanagawa (JP); Yoshihisa Kojima, Kanagawa (JP); Kazutaka Takizawa, Kanagawa (JP)

(73) Assignee: Toshiba Memory Corporation, Tokyo (JP)

(*) Notice: Subject to any disclaimer, the term of this patent is extended or adjusted under 35 U.S.C. 154(b) by 0 days.

(21) Appl. No.: 16/210,481

(22) Filed: Dec. 5, 2018

(65) Prior Publication Data

US 2019/0267100 A1 Aug. 29, 2019

(30) Foreign Application Priority Data

Feb. 28, 2018 (JP) ................. 2018-034816

(51) Int. Cl.
| | |
|---|---|
| *G11C 16/04* | (2006.01) |
| *G11C 16/26* | (2006.01) |
| *G11C 16/34* | (2006.01) |
| *G11C 11/56* | (2006.01) |
| *G06F 3/06* | (2006.01) |
| *G11C 7/04* | (2006.01) |
| *G11C 16/32* | (2006.01) |

(52) U.S. Cl.
CPC ............. *G11C 16/26* (2013.01); *G06F 3/061* (2013.01); *G06F 3/0659* (2013.01); *G06F 3/0679* (2013.01); *G11C 7/04* (2013.01); *G11C 11/5671* (2013.01); *G11C 16/0466* (2013.01); *G11C 16/32* (2013.01); *G11C 16/349* (2013.01)

(58) Field of Classification Search
CPC ....... G11C 16/26; G11C 7/04; G11C 11/5671; G11C 16/0466; G11C 16/32; G11C 16/349; G06F 3/061; G06F 3/0659; G06F 3/0679
See application file for complete search history.

(56) References Cited

U.S. PATENT DOCUMENTS

| | | | |
|---|---|---|---|
| 8,971,123 B2 * | 3/2015 | Marko ................ | G11C 16/20 365/185.21 |
| 9,437,305 B2 | 9/2016 | Lu et al. | |
| 9,535,614 B2 * | 1/2017 | Reddy ................ | G06F 3/0616 |
| 9,665,426 B2 | 5/2017 | Chen et al. | |
| 9,767,913 B2 | 9/2017 | Nagashima | |
| 10,373,656 B2 * | 8/2019 | Takada ............... | G06F 3/0619 |

* cited by examiner

*Primary Examiner* — Pho M Luu
(74) *Attorney, Agent, or Firm* — Kim & Stewart LLP

(57) ABSTRACT

A memory system includes a nonvolatile semiconductor memory including memory cells storing data, and a controller configured to control a read operation of the nonvolatile semiconductor memory to read data from the nonvolatile semiconductor memory. The controller is configured to determine a read voltage to be used for reading data from the nonvolatile semiconductor memory depending on whether the read operation is performed during a first period after an end of a write operation of the data or during a second period following the first period, upon determining that the read operation is performed during the first period, change the read voltage in accordance with an elapsed time after the end of the write operation of the data, and upon determining that the read operation is performed during the second period, determine the read voltage regardless of the elapsed time after the end of the write operation of the data.

20 Claims, 20 Drawing Sheets

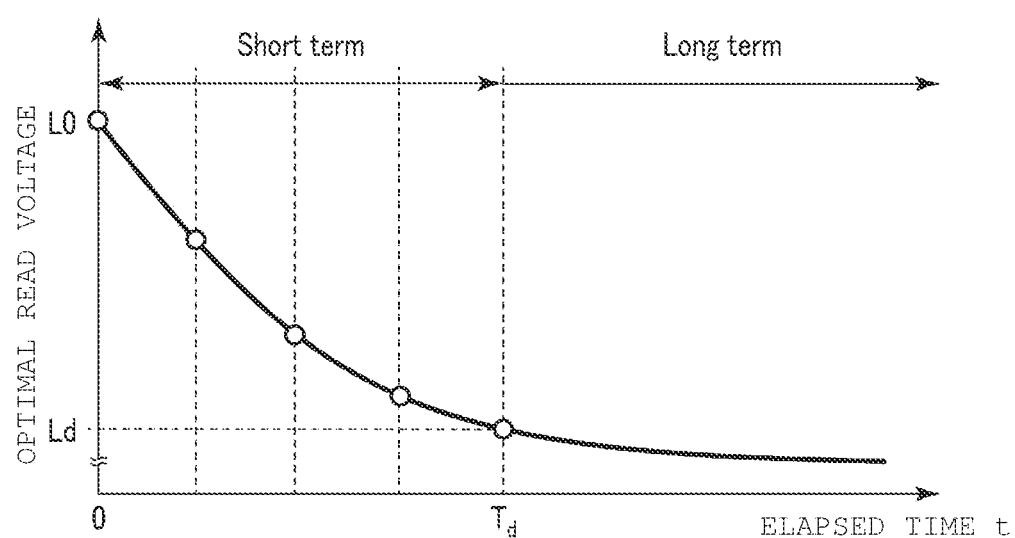

FIG. 12

SETTING VALUE TABLE

| Short/Long term | ELAPSED TIME (s) | TEMPERATURE 10°C, W/E=1k cycles | | | | | | |
|---|---|---|---|---|---|---|---|---|
| | | READ VOLTAGE (V) | | | | | | |
| | | State A | State B | State C | State D | State E | State F | State G |
| Short term | 0 | ... | ... | ... | ... | ... | ... | ... |
| | 5 | ... | ... | ... | ... | ... | ... | ... |
| | 10 | ... | ... | ... | ... | ... | ... | ... |
| | 15 | ... | ... | ... | ... | ... | ... | ... |
| | 20 | ... | ... | ... | ... | ... | ... | ... |
| | 25(Td) | ... | ... | ... | ... | ... | ... | ... |
| Long term | After 25 | ... | ... | ... | ... | ... | ... | ... |

| | |
|---|---|
| TEMPERATURE 10°C, W/E=1k cycles | STRESS CONDITION #1 |
| Short term | |
| Long term | |
| TEMPERATURE 10°C, W/E=2k cycles | STRESS CONDITION #2 |
| Short term | |
| Long term | |
| ... | |
| TEMPERATURE 80°C, W/E=15k cycles | STRESS CONDITION #M |
| Short term | |
| Long term | |

FIG. 13

HISTORY VALUE TABLE

Block #0

| READ VOLTAGE IN LONG TERM (V) | | | | | | | |
|---|---|---|---|---|---|---|---|
| State A | State B | State C | State D | State E | State F | State G | |
| ... | ... | ... | ... | ... | ... | ... | ... |

| Block #0 LONG TERM HISTORY VALUE | Block #1 LONG TERM HISTORY VALUE | ... | Block #2500 LONG TERM HISTORY VALUE |
|---|---|---|---|

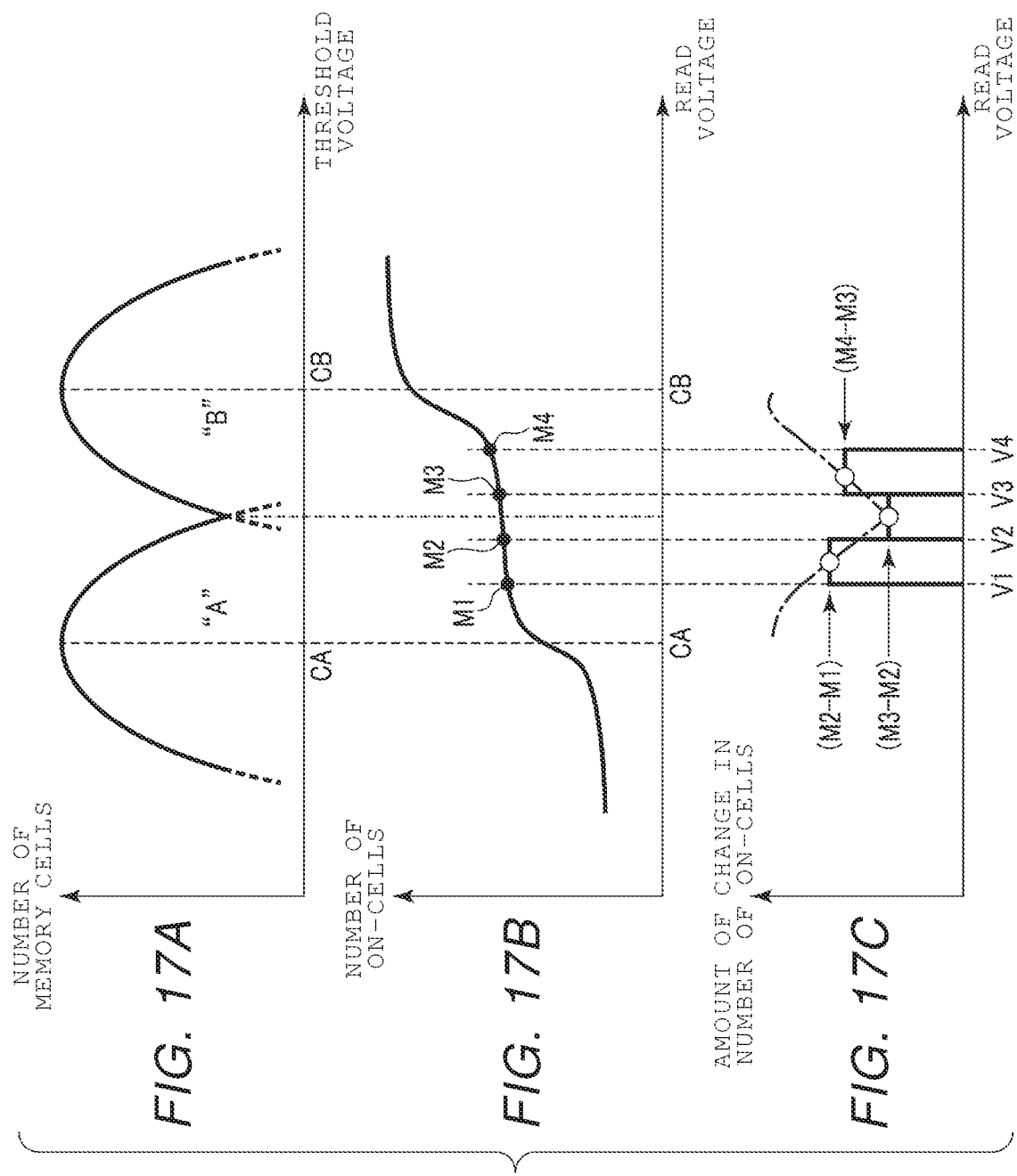

MEMORY SYSTEM

CROSS-REFERENCE TO RELATED APPLICATIONS

This application is based upon and claims the benefit of priority from Japanese Patent Application No. 2018-034816, filed Feb. 28, 2018, the entire contents of which are incorporated herein by reference.

FIELD

Embodiments described herein relate generally to a memory system.

BACKGROUND

As one type of semiconductor storage device, NAND flash memory is well-known. In addition, NAND flash memory including memory cells that are three-dimensionally stacked are well-known.

In NAND flash memory, during a short period after programming, a phenomenon, known as short term data retention (STDR), occurs in which a threshold voltage distribution is greatly shifts in the negative direction. With this phenomena, it is difficult to set a read voltage used for reading data from a memory cell array to follow such a change in the threshold voltage distribution. In other words, it is difficult to set an optimal read voltage. As a result, the number of retry read operations from the NAND flash memory increases, and thus, read performance of the NAND flash memory deteriorates.

DESCRIPTION OF THE DRAWINGS

FIG. 10 is a diagram illustrating one example of a boundary time table;

FIG. 11 is a schematic diagram illustrating one example of relationship between multiple read voltages and multiple elapsed time periods stored in a setting value table;

FIG. 12 is a diagram illustrating one example of a setting value table;

FIG. 13 is a diagram illustrating one example of a history value table;

FIGS. 17A to 17C are schematic diagrams illustrating a threshold voltage tracking operation.

DETAILED DESCRIPTION

Embodiments provide a memory system capable of improving read performance.

In general, according to one embodiment, a memory system includes a nonvolatile semiconductor memory including memory cells storing data, and a controller configured to control a read operation of the nonvolatile semiconductor memory to read data from the nonvolatile semiconductor memory. The controller is configured to determine a read voltage to be used for reading data from the nonvolatile semiconductor memory depending on whether the read operation is performed during a first period after an end of a write operation of the data or during a second period following the first period, upon determining that the read operation is performed during the first period, change the read voltage in accordance with an elapsed time after the end of the write operation of the data, and upon determining that the read operation is performed during the second period, determine the read voltage regardless of the elapsed time after the end of the write operation of the data.

Hereinafter, embodiments will be described with reference to the drawings. Several embodiments illustrated below represent devices and methods for implementing a technical idea of the present disclosure, and the technical idea of the present disclosure is not limited to the shapes, structures, arrangements, and the like of components described herein. Each functional block may be implemented by either hardware or software, or a combination thereof. However, each functional block does not need to be divided as in the following examples. For example, some functions may be executed by functional blocks other than functional blocks illustrated herein. In addition, a functional block may be further divided into smaller functional sub-blocks. In the following description, the same reference sign will be assigned to elements having the same function and configuration, and duplicate description thereof will not be given unless needed.

1 First Embodiment

1-1 Configuration of Memory System

Figure 1:
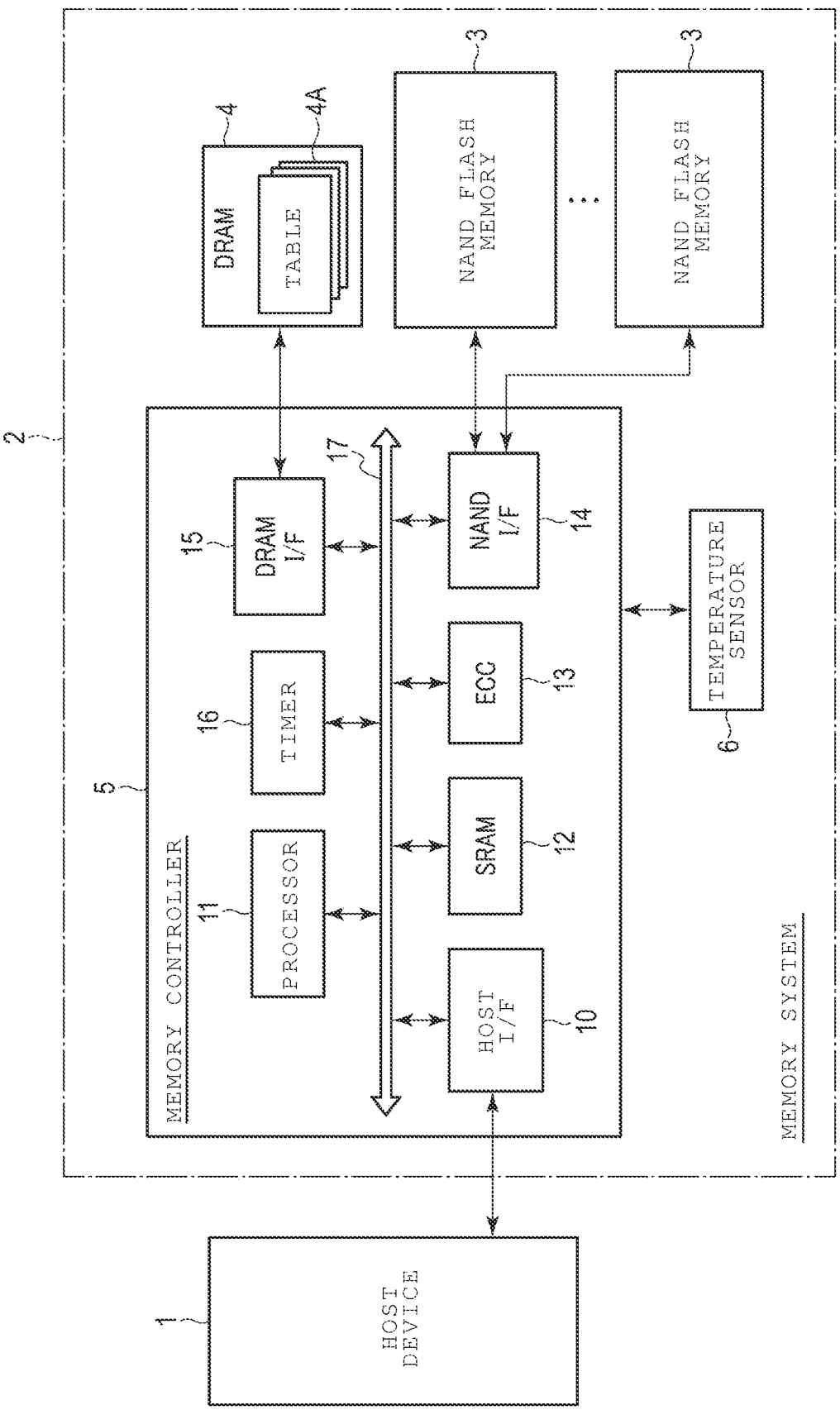
FIG. 1 is a block diagram of a memory system according to a first embodiment.

FIG. 1 is a block diagram of a memory system 2 according to a first embodiment. The memory system 2 is connected to a host device 1. The host device 1 is an information processing device such as a server or a personal computer.

The memory system 2 may be mounted on a main board in which the host device 1 is installed. The memory system 2 may be implemented as a plurality of chips, a large-scale integrated circuit (LSI) in one module or a system-on-a-chip (SoC). The memory system 2 may be a memory card such as a solid-state drive (SSD) or an SD™ card, an embedded multimedia card (eMMC), or the like. Typically, the memory system 2 is an SSD.

As illustrated in FIG. 1, the memory system 2 includes: a NAND flash memory (more generally referred to as nonvolatile semiconductor memory) 3 or a plurality of NAND flash memory chips or packages; a dynamic random access memory (DRAM) 4; a memory controller 5; a temperature sensor 6; and the like.

Each NAND flash memory 3 includes plural memory cells and stores data in a nonvolatile manner. A specific configuration of the NAND flash memory 3 will be described later.

The DRAM 4 is one type of volatile memory. The DRAM 4 stores plural tables 4A. The plural tables 4A include i) tables stored in the NAND flash memory 3 in a nonvolatile manner and loaded from the NAND flash memory 3 and ii) tables generated by the memory controller 5 during various operations. In addition, some areas of the DRAM 4 are used as a write buffer used for temporarily storing data to be written in the NAND flash memory 3 and a read buffer used for temporarily storing data read from the NAND flash memory 3.

The temperature sensor 6 detects a temperature of the memory system 2 or a temperature of elements of the memory system 2. The detected temperature using the temperature sensor 6 is transmitted to the memory controller 5. The temperature sensor 6 may be built in the NAND flash memory 3.

In response to a command from the host device 1, the memory controller 5 directs the NAND flash memory 3 to execute write (also called programming), read, or erase operation, or the like. In addition, the memory controller 5 manages a memory space of the NAND flash memory 3. The memory controller 5 includes: a host interface circuit (host I/F) 10; a processor 11; a static random access memory (SRAM) 12; an error checking and correcting (ECC) circuit 13; a NAND interface circuit (NAND I/F) 14; a DRAM interface circuit (DRAM I/F) 15; a timer 16; and the like. Such modules are interconnected via a bus 17. The memory controller 5 may be formed as a system-on-a-chip (SoC).

The host interface circuit 10 is connected to the host device 1 via a host bus. The host interface circuit 10 performs a process for interfacing with the host device 1 in compliance with a predetermined protocol. Specifically, the host interface circuit 10 transmits/receives a command, an address, and data to/from the host device 1. Examples of the host interface include a serial advanced technology attachment (SATA), a peripheral component interconnect Express® (PCIe), a serial attached SCSI (SAS), a non-volatile memory Express® (NVMe), and the like.

The processor 11 is, for example, a central processing unit (CPU). The processor 11 controls the overall operation of the memory controller 5. For example, when a write command is received from the host device 1, the processor 11 issues a write command on the basis of the NAND interface protocol to the NAND flash memory 3 in response to the received command. This similarly applies to the case of reading or erasing. In addition, the processor 11 executes various processes for managing the NAND flash memory 3 such as wear-leveling, garbage collection, and the like.

The SRAM 12 is one type of volatile memory. The SRAM 12 is used as a work area of the processor 11 and stores firmware loaded from the NAND flash memory 3 and the like.

When data is to be written, the ECC circuit 13 generates an error correcting code for the write data, appends the error correcting code to the write data, and transmits resultant data to the NAND interface circuit 14. In addition, when data is being read, the ECC circuit 13 performs error detection and/or error correction for the read data, using the error correcting code included in the read data.

The NAND interface circuit 14 is connected to the NAND flash memory 3 via a NAND bus. The NAND interface circuit 14 performs a process for interfacing with the NAND flash memory 3 in compliance with a predetermined protocol. In addition, the NAND interface circuit 14 transmits/receives a command, an address, and data to/from the NAND flash memory 3.

The DRAM interface circuit 15 is connected to the DRAM 4 via the DRAM bus. The DRAM interface circuit 15 performs a process for interfacing with the DRAM 4 in compliance with a predetermined protocol.

The timer 16 is circuit for measuring time. A result of the measurement using the timer 16 is transmitted to the processor 11. The processor 11 manages the current time, a time stamp, and the like by using the result of the measurement using the timer 16.

1-1-1 Configuration of NAND Flash Memory 3

Figure 2:
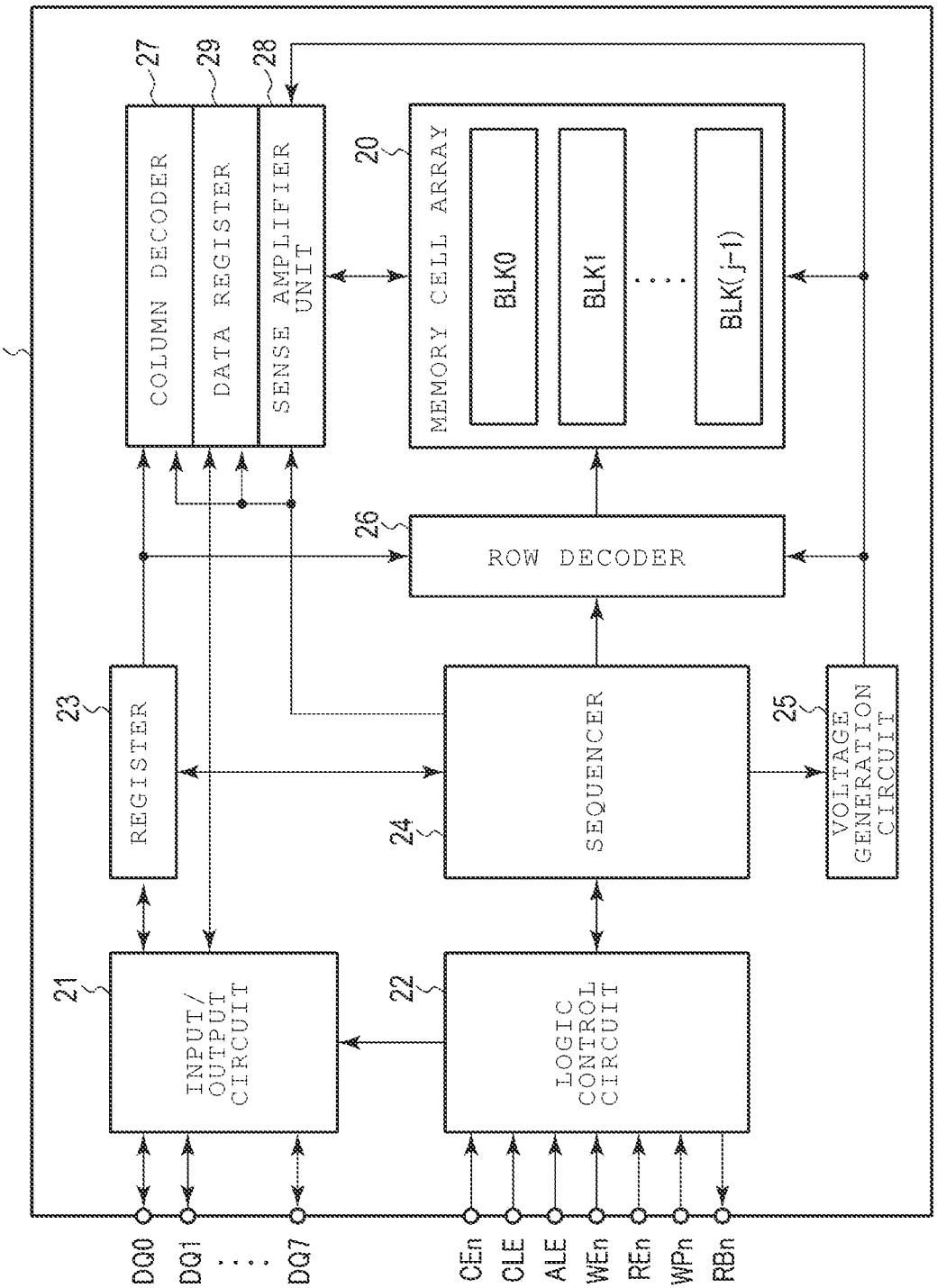
FIG. 2 is a block diagram of a NAND flash memory illustrated in FIG. 1.

FIG. 2 is a block diagram of the NAND flash memory 3 illustrated in FIG. 1.

The NAND flash memory 3 includes: a memory cell array 20; an input/output circuit 21; a logic control circuit 22; a register 23; a sequencer (which is a control circuit) 24; a voltage generation circuit 25; a row decoder 26; a column decoder 27; a sense amplifier unit 28; and a data register (which is a data cache) 29.

The memory cell array 20 includes j blocks BLK0 to BLK(j−1). Here, j is an integer of "1" or more. Each of the plural blocks BLK includes plural memory cell transistors. The memory cell transistor is formed of a memory cell that is electrically rewritable. In the memory cell array 20, in order to apply voltages to the memory cell transistors, plural bit lines, plural word lines, a source line, and the like are disposed. A specific configuration of the block BLK will be described later.

The input/output circuit 21 and the logic control circuit 22 are connected to the memory controller 5 via the NAND bus. The input/output circuit 21 transmits/receives signals DQ (for example, DQ0 to DQ7) to/from the memory controller 5 via the NAND bus.

The logic control circuit 22 receives external control signals (for example, a chip enable signal CEn, a command latch enable signal CLE, an address latch enable signal ALE, a write enable signal WEn, a read enable signal REn, and a write protect signal WPn) from the memory controller 5 via the NAND bus. Here, "n" appended to a signal name signifies that the signal is asserted at a low logic level. In addition, the logic control circuit 22 transmits a ready/busy signal RBn to the memory controller 5 via the NAND bus.

The signal CEn enables selection of the NAND flash memory 3 and is asserted when the NAND flash memory 3 is selected. The signal CLE enables a command transmitted as the signal DQ to be latched in a command register. The signal ALE enables an address transmitted as the signal DQ to be latched in an address register. The signal WEn enables data to be input to the NAND flash memory 3 as the signal DQ. The signal REn enables data to be output from the NAND flash memory 3 as the signal DQ. The signal WPn is asserted when write and erase are prohibited. The signal RBn represents whether the NAND flash memory 3 is in a ready state (a state in which a command can be received from the outside) or a busy state (a state in which a command cannot be received from the outside). The memory controller 5 acquires the state of the NAND flash memory 3 by receiving the signal RBn from the NAND flash memory 3.

The register 23 includes a command register, an address register, a status register, and the like. The command register temporarily stores a command. The address register temporarily stores an address. The status register temporarily stores data that is necessary for the operation of the NAND flash memory 3. The register 23, for example, is formed of SRAM.

The control circuit 24 receives a command from the register 23 and controls the NAND flash memory 3 in accordance with a sequence based on the command.

The voltage generation circuit 25 receives a power supply voltage from the outside of the NAND flash memory 3 and generates plural voltages that are necessary for a write operation, a read operation, and an erase operation using the power supply voltage. The voltage generation circuit 25 supplies the generated voltages to the memory cell array 20, the row decoder 26, the sense amplifier unit 28, and the like.

The row decoder 26 receives a row address from the register 23 and decodes the row address. The row decoder 26 performs an operation of selecting a word line and the like based on the decoded row address. Then, the row decoder 26 transmits plural voltages that are necessary for a write operation, a read operation, or an erase operation to the selected block BLK.

The column decoder 27 receives a column address from the register 23 and decodes the column address. The column decoder 27 performs an operation of selecting a bit line based on the decoded column address.

When data is read, the sense amplifier unit 28 detects and amplifies data read from the memory cell transistor onto a bit line. In addition, when data is written, the sense amplifier unit 28 transmits write data onto the bit line.

When data is read, the data register 29 temporarily stores data transmitted in parallel form from the sense amplifier unit 28 and transmits the data to the input/output circuit 21 in serial form. In addition, when data is written, the data register 29 temporarily stores data transmitted from the input/output circuit 21 in serial form and transmits the data to the sense amplifier unit 28 in parallel form. The data register 29 is formed of SRAM or the like.

1-1-2 Configuration of Block BLK

Figure 3:
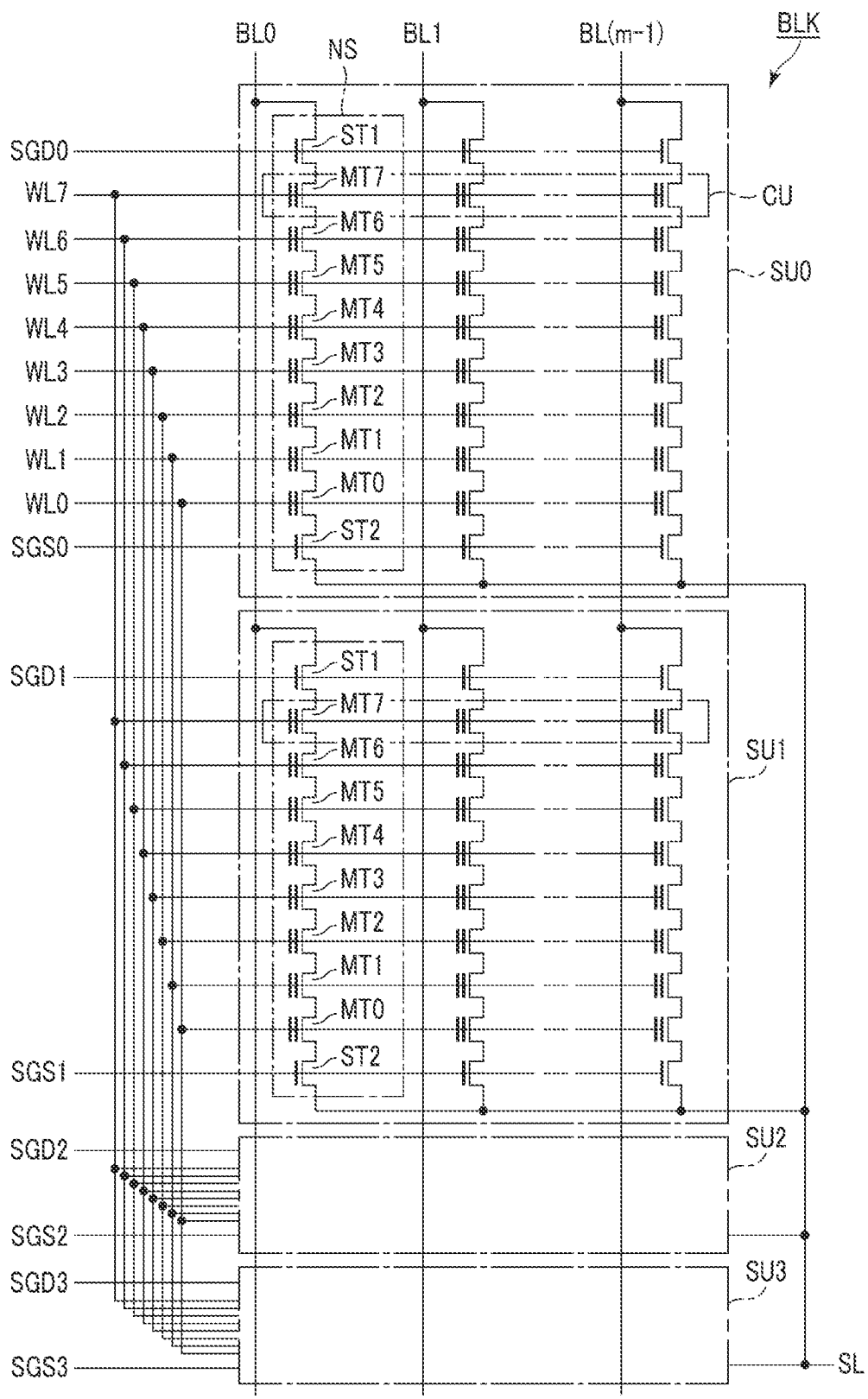
FIG. 3 is a circuit diagram of one block BLK in a memory cell array illustrated in FIG. 2.

FIG. 3 is a circuit diagram of one block BLK in the memory cell array 20. Each of the plural blocks BLK includes plural string units SU. In FIG. 3, four string units SU0 to SU3 are illustrated as an example. The number of string units SU in one block BLK may be any number.

Each of the plural string units SU includes plural NAND strings (memory strings) NS. The number of NAND strings NS included in one string unit SU may be any number.

Each of the plural NAND strings NS includes plural memory cell transistors MT and two select transistors ST1 and ST2. The plural memory cell transistors MT are connected in series between a source of the select transistor ST1 and a drain of the select transistor ST2. In this specification, a memory cell transistor may be referred to as a memory cell or a cell. FIG. 3 illustrates an example of the configuration in which the NAND string NS includes 8 memory cell transistors MT (MT0 to MT7) for the simplification of description, the number of memory cell transistors MT in the NAND string NS is actually more than that and may be set to any number. The memory cell transistor MT includes a control gate electrode and an electric charge accumulating layer and stores data in a nonvolatile manner. The memory cell transistor MT stores data of one bit or data of two or more bits.

The gates of plural select transistors ST1 in the string unit SU0 are commonly connected to a select gate line SGD0, and similarly, select gate lines SGD1 to SGD3 are respectively connected in string units SU1 to SU3. The gates of plural select transistors ST2 in the string unit SU0 are commonly connected to a select gate line SGS0, and similarly, select gate lines SGS1 to SGS3 are respectively connected in string units SU1 to SU3. In addition, a common select gate line SGS may be connected to the select gate lines SGS0 to SGS3 in the string units SU0 to SU3 in each block BLK. The control gates of memory cell transistors MT0 to MT7 disposed in each block BLK are respectively connected to word lines WL0 to WL7.

Among NAND strings NS arranged in a matrix pattern in each block BLK, the drains of select transistors ST1 of plural NAND strings NS disposed in a same column are commonly connected to one of bit lines BL0 to BL(m−1). Here, "m" is an integer of "1" or more. In addition, each bit line BL is commonly connected to plural blocks BLK and is connected to one NAND string NS in each string unit SU provided in each of the plural blocks BLK. The sources of plural select transistors ST2 in each block BLK are commonly connected to a source line SL. The source line SL, for example, is commonly connected to plural blocks BLK.

Data of plural memory cell transistors MT in each block BLK, for example, is erased together. Reading and writing of data are performed together for plural memory cell transistors MT that are commonly connected to one word line WL disposed in one string unit SU. A set of memory cell transistors MT shared by one word line WL in one string unit SU will be referred to as a cell unit CU. A grouping of data of one bit stored by each of plural memory cell transistors MT in the cell unit CU will be referred to as a page. In other words, a write operation and a read operation for a cell unit CU are executed in units of pages.

In addition, the NAND string NS may further include a dummy cell transistor. More specifically, between the select transistor ST2 and the memory cell transistor MT0, for example, two dummy cell transistors DT0 and DT1 (not illustrated) are connected in series. Between the memory cell transistor MT7 and the select transistor ST1, for example, two dummy cell transistors DT2 and DT3 (not illustrated) are connected in series. Dummy word lines DWL0 to DWL3 are respectively connected to the gates of the dummy cell transistors DT0 to DT3. The structure of the dummy cell transistor is the same as that of the memory cell transistor. The dummy cell transistor is not for storing data and has a function of alleviating disturbance received by the memory cell transistor and the select transistor during a write operation or an erase operation.

1-1-3 Stacking Structure of Block BLK

Figure 4:
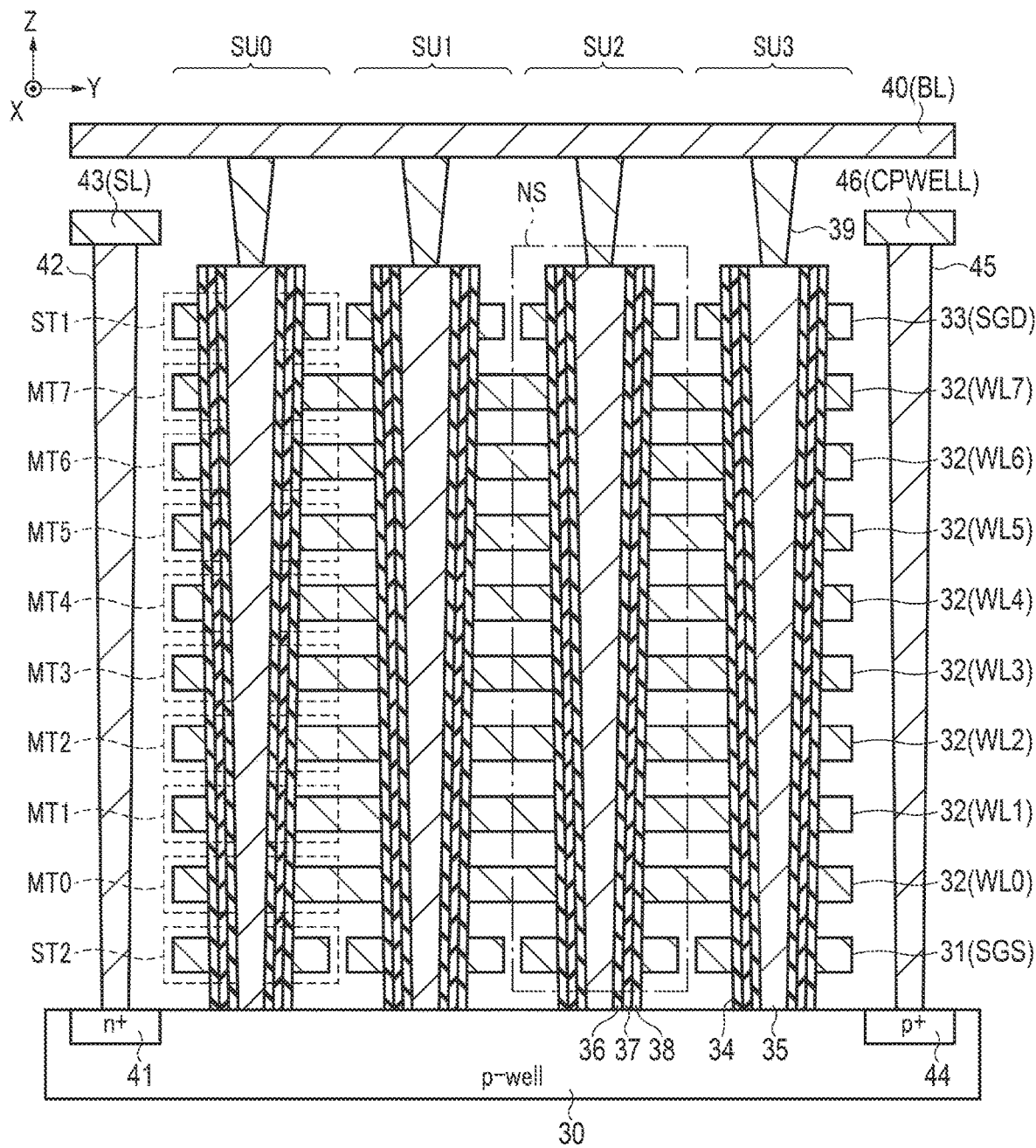
FIG. 4 is a cross-sectional diagram of a part of a block.

FIG. 4 is a cross-sectional diagram of an area of a part of a block BLK. In FIG. 4, an X direction is a direction in which a select gate line extends, a Y direction intersecting with the X direction on a horizontal plane is a direction in which a bit line extends, and a Z direction is the stacking direction.

On a semiconductor layer, a p-type well region (p-well) 30 is disposed. Above the p-type well region 30, plural NAND strings NS are disposed. In other words, above the well region 30, a wiring layer 31 functioning as a select gate line SGS, eight wiring layers 32 functioning as word lines WL0 to WL7, and a wiring layer 33 functioning as a select gate line SGD are stacked in this order with plural insulating layers interposed therebetween. In order to avoid complications of drawings, hatchings of plural insulating layers disposed between plural stacked wiring layers are omitted.

A memory hole 34 passes through the wiring layers 31, 32, and 33 and reaches the well region 30. In the memory hole 34, a pillar-shaped semiconductor layer (semiconductor pillar) 35 is disposed. On a side face of the semiconductor pillar 35, a gate insulating film 36, an electric charge accumulating layer (which, in one embodiment, is an insulating film) 37, and a block insulating film 38 are sequentially provided. By using these, the memory cell transistor MT and the select transistors ST1 and ST2 are formed. The semiconductor pillar 35 functions as a current path of the NAND string NS and is a region in which the channel of each transistor is formed. An upper end of the semiconductor pillar 35 is connected to a metal wiring layer 40 functioning as a bit line BL via a contact plug 39.

On the surface area of the well region 30, an $n^+$-type diffusion region 41 in which $n^+$-type impurities of high concentration are introduced is disposed. A contact plug 42 is disposed on the diffusion region 41, and the contact plug 42 is connected to a metal wiring layer 43 functioning as a source line SL. In addition, on the surface area of the well region 30, a pt-type diffusion region 44 in which p-type impurities of high concentration are introduced is disposed. A contact plug 45 is disposed on the diffusion region 44, and the contact plug 45 is connected to a metal wiring layer 46 functioning as a well wiring CPWELL. The well wiring CPWELL is a wiring used for applying a voltage to the semiconductor pillar 35 via the well region 30.

Plural structures having the configuration described above are arranged in a depth direction (X direction) of FIG. 4, and a string unit SU is a set of plural NAND strings NS aligned in the X direction.

1-1-4 Threshold Voltage Distribution of Memory Cell Transistors

Figure 5:
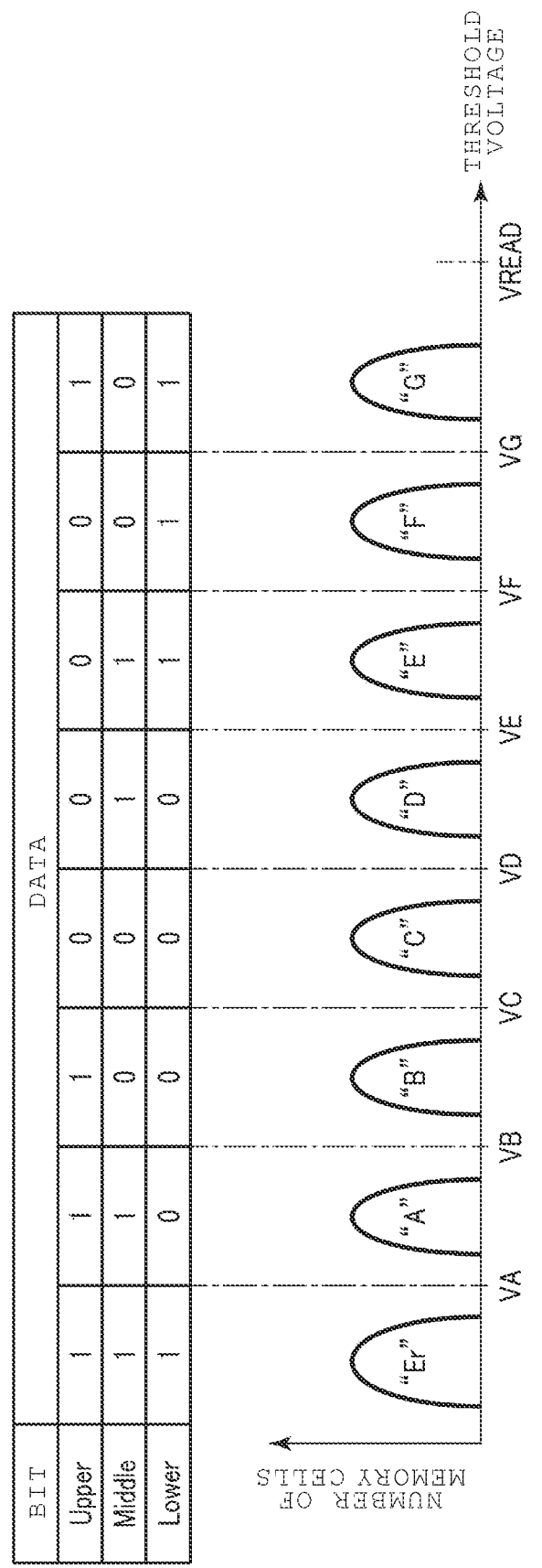
FIG. 5 is a schematic diagram illustrating one example of a threshold voltage distribution of memory cell transistors.

Next, the distribution of threshold voltages Vth of the memory cell transistors MT will be described. FIG. 5 is a schematic diagram illustrating one example of a threshold voltage distribution of the memory cell transistors MT. The memory cell transistor MT stores data of two bits or more. In this embodiment, a case in which the memory cell transistor MT stores data of three bits, so-called a triple level cell (TLC) method will be described as an example.

The data of three bits is defined using a lower bit, a middle bit, and an upper bit. When the memory cell transistor MT stores three bits, the memory cell transistor MT may take one of eight states relating to its threshold voltage. The eight states will be referred to as states "Er", "A", "B", "C", "D", "E", "F", and "G" in order from the lowest state to the highest state in terms of the threshold voltage. Plural memory cell transistors MT belonging to the states "Er", "A", "B", "C", "D", "E", "F", and "G" form a distribution.

For example, data "111", data "110", data "100", data "000", data "010", data "011", data "001", and data "101" are respectively assigned to the states "Er", "A", "B", "C", "D", "E", "F", and "G". The order of the bits is the upper bit, the middle bit, and the lower bit from the left side. The assignment of the threshold voltage distribution and the data may be set in any manner.

In order to read data stored in a memory cell transistor MT that is a target for reading, a state to which the threshold voltage of the memory cell transistor MT belongs is determined. In order to determine the state, read voltages VA, VB, VC, VD, VE, VF, and VG are used.

The state "Er", for example, corresponds to a state in which data is erased (this state is commonly referred to as an erased state). A threshold voltage of the memory cell transistor MT belonging to the state "Er" is lower than the voltage VA and, for example, has a negative value.

The states "A" to "G" correspond to states in which data is written in the memory cell transistor MT by injecting electric charge to the electric charge accumulating layer, and a threshold voltage of the memory cell transistor MT belonging to each state, for example, has a positive value. A threshold voltage of the memory cell transistor MT belonging to the state "A" is higher than the read voltage VA and is lower than or equal to the read voltage VB. A threshold voltage of the memory cell transistor MT belonging to the state "B" is higher than the read voltage VB and is lower than or equal to the read voltage VC. A threshold voltage of the memory cell transistor MT belonging to the state "C" is higher than the read voltage VC and is lower than or equal to the read voltage VD. A threshold voltage of the memory cell transistor MT belonging to the state "D" is higher than the read voltage VD and is lower than or equal to the read voltage VE. A threshold voltage of the memory cell transistor MT belonging to the state "E" is higher than the read voltage VE and is lower than or equal to the read voltage VF. A threshold voltage of the memory cell transistor MT belonging to the state "F" is higher than the read voltage VF and is lower than or equal to the read voltage VG. A threshold voltage of the memory cell transistor MT belonging to the state "G" is higher than the read voltage VG and is lower than or equal to a read pass voltage VREAD. The read pass voltage VREAD is a voltage applied to a word line WL connected to the memory cell transistor MT of the cell unit CU that is a non-read target and is higher than the threshold voltage of the memory cell transistor MT in any state. In other words, a memory cell transistor MT in which the read pass voltage VREAD is applied to the control gate is in an ON state regardless of data therein.

As described above, each memory cell transistor MT may be in one of eight states. In addition, a write operation and a read operation are performed in units of pages in one cell unit CU. In a case in which the memory cell transistor MT stores data of three bits, a lower bit, a middle bit, and an upper bit are assigned to three pages in one cell unit CU. In the following description, a page corresponding to lower bits is referred to as a lower page, a page corresponding to middle bits is referred to as middle pages, and a page corresponding to upper bits is referred to as an upper page.

1-1-5 Configuration of Sense Amplifier Unit 28 and Data Register 29

Figure 6:
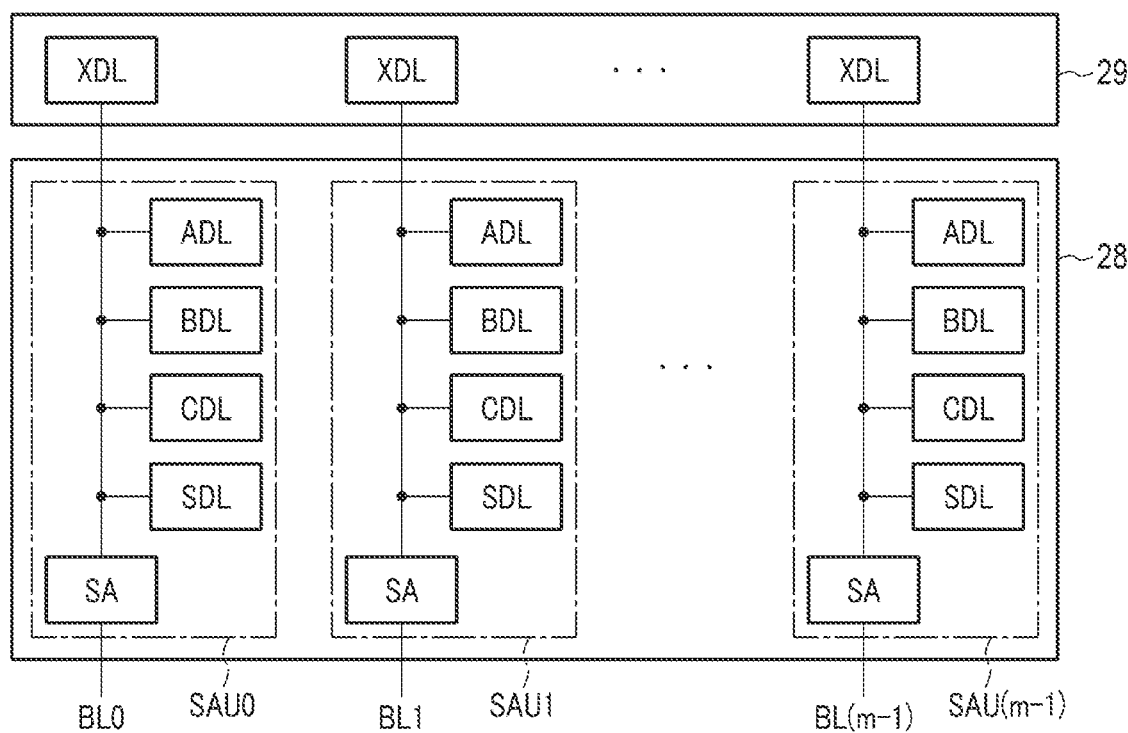
FIG. 6 is a block diagram of a sense amplifier unit and a data register illustrated in FIG. 2.

FIG. 6 is a block diagram of the sense amplifier unit 28 and the data register 29 illustrated in FIG. 2.

The sense amplifier unit 28 includes sense amplifier units SAU0 to SAU (m−1) corresponding to bit lines BL0 to BL (m−1). Each sense amplifier unit SAU includes a sense amplifier SA and data latch circuits SDL, ADL, BDL, and CDL. The sense amplifier SA and the data latch circuits SDL, ADL, BDL, and CDL are connected such that data can be transmitted between them.

The data latch circuits SDL, ADL, BDL, and CDL temporarily store data. When a write operation is performed, the sense amplifier SA controls the voltage of the bit line BL in accordance with data stored by the data latch circuit SDL. The data latch circuits ADL, BDL, and CDL are used for a multi-value operation in which the memory cell transistor MT stores data of two or more bits. In other words, the data latch circuit ADL is used for storing the lower page. The data latch circuit BDL is used for storing the middle page. The data latch circuit CDL is used for storing the upper page. The number of data latch circuits in the sense amplifier unit SAU may be changed in any manner in accordance with the number of bits stored by one memory cell transistor MT.

When a read operation is performed, the sense amplifier SA detects data read in a corresponding bit line BL and determines whether the read data is data "0" or data "1". In addition, when a write operation is performed, the sense amplifier SA applies a voltage to a bit line BL based on write data.

The data register 29 includes data latch circuits XDL of a number corresponding to the sense amplifier units SAU0 to SAU(m−1). The data latch circuit XDL is connected to the input/output circuit 21. The data latch circuit XDL temporarily stores write data transmitted from the input/output circuit 21 and temporarily stores read data transmitted from the sense amplifier unit SAU. More specifically, data transmission between the input/output circuit 21 and the sense amplifier unit 28 is performed via the data latch circuits XDL corresponding to one page. The write data received by the input/output circuit 21 is transmitted to one of the data latch circuits ADL, BDL, and CDL via the data latch circuit XDL. The read data read by the sense amplifier SA is transmitted to the input/input circuit 21 via the data latch circuit XDL.

1-2 Operation

Next, the operation of the memory system 2 configured as described above will be described.

An operation of writing data into the memory cell transistor MT and an operation of reading data from the memory cell transistor MT illustrated in FIGS. 3 and 4 will be described.

The write operation of writing data in the memory cell transistor MT is performed as follows. The write operation includes a program operation and a verify operation. In addition, in the write operation, a program loop formed by a program operation and a verify operation is repeated a plural number of times.

The program operation is an operation of raising the threshold voltage of the memory cell transistor MT by injecting electric charge (electrons) into the electric charge accumulating layer of the memory cell transistor MT or maintaining a threshold voltage of the memory cell transistor MT by prohibiting injection of electrons into the electric charge accumulating layer, depending on the write data. The operation of raising the threshold voltage will be referred to as '"0" write', and the operation of maintaining the threshold voltage will be referred to as ' "1" write'" or 'write prohibition'. More specifically, a voltage applied to a bit line BL is different between "0" write and "1" write. For example, a ground voltage VSS is applied to a bit line BL corresponding to "0" write. In addition, for example, a power supply voltage VDD (>VSS) is applied to a bit line BL corresponding to "1" write.

The row decoder 26 applies a program voltage VPGM to a selected word line WL and applies a program pass voltage VPASS (<VPGM) to non-selected word lines WL. The program pass voltage VPASS is a voltage for preventing unintended write to a non-selected memory cell transistor MT by causing the memory cell transistor MT to be in the ON state regardless of the threshold voltage of the memory cell transistor MT. In addition, the row decoder 26 applies a voltage VSGD to a select gate line SGD and applies a voltage VSS to a select gate line SGS. The voltage VSGD is a voltage causing the select transistor ST1 connected to the selected bit line BL to be in the ON state and causing the select transistor ST1 connected to the non-selected bit line BL to be in the OFF state. For example, the voltage VSS or a voltage slightly higher than the voltage VSS is applied to the source line SL.

Accordingly, in the memory cell transistor MT of a write target, a voltage difference between the word line WL and the channel is large, and the threshold voltage of the memory cell transistor MT increases. On the other hand, in the memory cell transistor MT of write prohibition, a voltage difference between the word line WL and the channel is small due to self-boost effect, and a change in the threshold voltage of the memory cell transistor MT is restrained.

The verify operation is an operation of reading data of the memory cell transistor MT and determining whether or not the threshold voltage of the memory cell transistor MT reached a target level after the program operation. A case in which the threshold voltage of the memory cell transistor MT reached the target level will be referred to as "verification passed", and a case in which the threshold voltage did not reached the target level will be referred to as "verification failed". Details of the verify operation are similar to those of the read operation.

Next, a read operation for reading data from the memory cell transistor MT will be described.

The row decoder 26 applies a read voltage VCG to a selected word line WL and applies a read pass voltage VREAD to non-selected word lines WL. In addition, the row decoder 26 applies a voltage VSG to select gate lines SGD and SGS. The voltage VSG is a voltage that causes the select transistors ST1 and ST2 to be in the ON state. The sense amplifier unit 28 applies a voltage VBL to all the bit lines BL. The voltage VBL is a voltage that is higher than the voltage VSS. The voltage VSS is applied to a source line SL. Accordingly, it is determined whether the memory cell transistor MT is turned ON or OFF, and the data of the memory cell transistor MT is read.

1-2-1 Change in Threshold Voltage Distribution

Next, changes in the threshold voltage distribution will be described.

Figure 7:
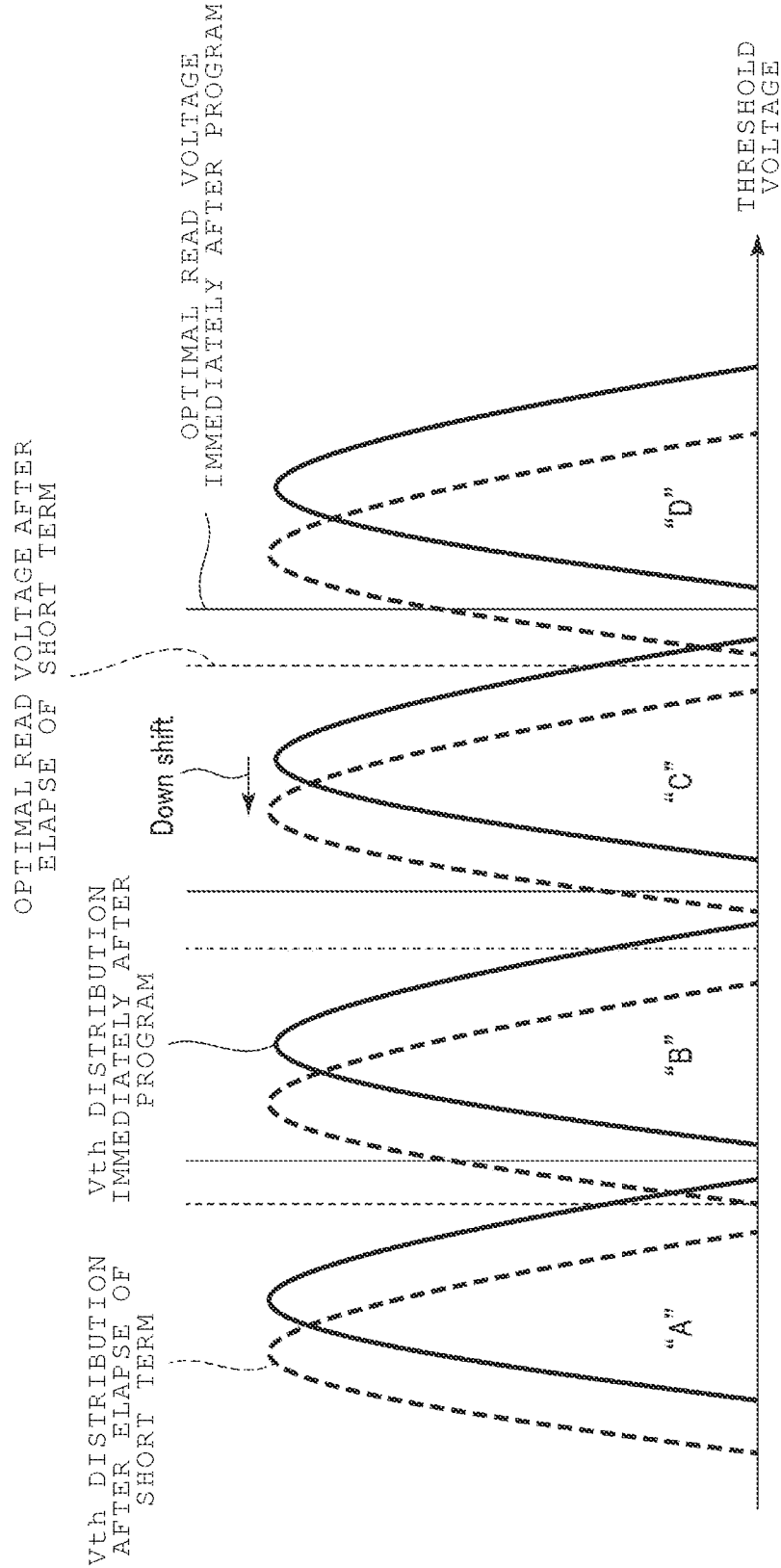
FIG. 7 is a schematic diagram illustrating changes in a threshold voltage distribution.

After the memory cell transistor MT is programmed, as electrons move out from the electric charge accumulating layer, the threshold voltage of the memory cell transistor MT may change. FIG. 7 is a schematic diagram illustrating an appearance of changes in the threshold voltage distribution. In FIG. 7, states "A" to "D" are extracted and illustrated.

In a NAND flash memory, particularly, in a three-dimensional NAND flash memory, after a memory cell transistor is programmed, the threshold voltage distribution may shift in the negative direction (down-shift, for short) in a short period of time (short term) immediately after programming. Due to the down-shift of the threshold voltage distribution, an optimal read voltage of each state also down-shifts. The optimal read voltage is a voltage at a valley position at which overlapping of neighboring threshold voltage distributions of two states is at a minimum.

In FIG. 7, a distribution represented using a solid line is a threshold voltage distribution (Vth distribution) immediately after programming, and a distribution represented using a broken line is a threshold voltage distribution after elapse of the short term. In addition, in FIG. 7, a read voltage represented using a vertical solid straight line is an optimal read voltage immediately after programming, and a read voltage represented using a vertical broken straight line is an optimal read voltage after elapse of the short term.

Figure 8:
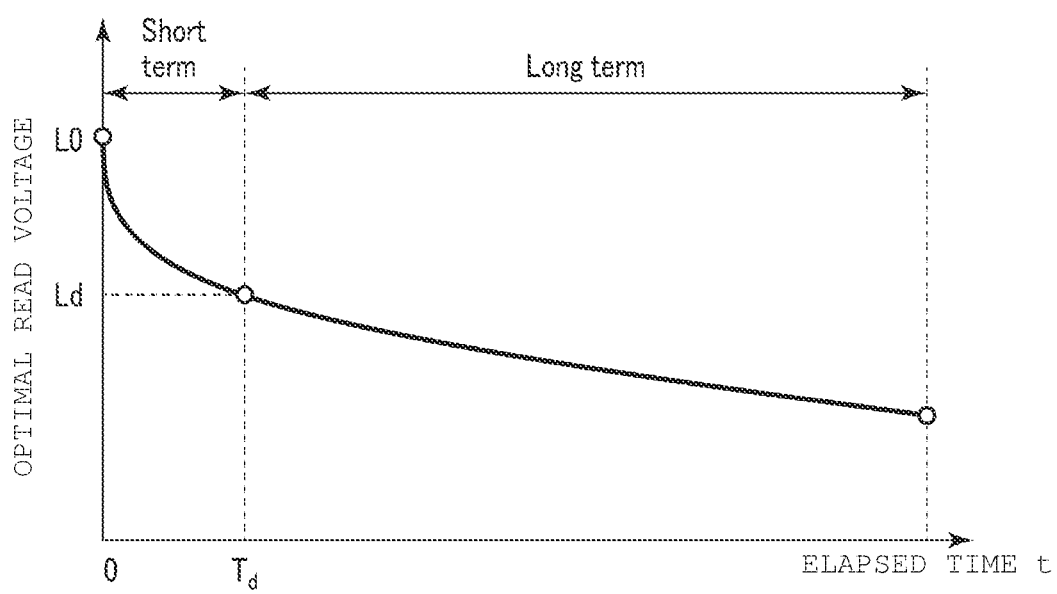
FIG. 8 is a graph illustrating changes in an optimal read voltage with respect to elapsed time.

FIG. 8 is a graph illustrating changes in the optimal read voltage with respect to an elapsed time from programming (hereinafter, may also be referred to as "an elapsed time period from programming", "an elapsed time period", or "an elapsed time"). In FIG. 8, the horizontal axis represents an elapsed time t from programming, and the vertical axis represents an optimal read voltage to be applied to a word line at the time of reading data. FIG. 8 is a graph relating to any threshold voltage.

Parameters illustrated in FIG. 8 are defined as follows.

"t=0": time t=0 is time immediately after programming.

"L0": read voltage L0 is an optimal read voltage at time t=0.

"Ld": read voltage Ld is an optimal read voltage at time Td.

"Td": time Td is boundary time between a short term and a long term. Since a down-shift rate of the optimal read voltage decreases as the elapsed time increases, time at which the down-shift rate becomes a predetermined value (for example, 0.001 mV/s) or less is defined as time Td at which switching between the short term and the long term occurs. For example, "Td" may be defined as a time at which the down-shift rate of the optimal read voltage becomes a certain predetermined value or less, or a time predetermined according to a temperature or stress condition.

"short term": the short term is a period from immediately after the program (t=0) until the time Td.

"long term": the long term is a period after the time Td (t>Td).

In FIG. 8, it can be understood that a change in the optimal read voltage with respect to an elapsed time is large in the short term. For this reason, adjustment of the read voltage in consideration of the elapsed time is necessary. Thus, in this embodiment, an elapsed time after the program is divided into a short term and a long term having the time Td as a boundary, and a read voltage correction method is changed between the short term and the long term.

1-2-2 Read Sequence

Next, the entire process of a read sequence will be described. FIGS. 9A to 9D are flowcharts illustrating a read sequence of the memory system 2. The read sequence is performed after the end of a write operation and is a series of processes for reading data from the NAND flash memory 3.

First, as described above, a write operation (a program operation and a verify operation) is performed for a selected page.

Subsequently, the memory controller 5 records end time of the programming in a time stamp management table (not illustrated in the drawings) (Step S100). The time stamp management table, for example, is stored in the DRAM 4. For example, the time stamp management table records end time of the programming for each word line. Alternatively, representative programming end time of a block may be recorded for each block. Here, the representative programming end time may be any one of last programming end time in the block, first programming end time in the block, and average programming end time in the block. The time is measured by the timer 16.

Subsequently, the memory controller 5 checks stress conditions such as a temperature, the number of write/erase cycles (the W/E cycles in short), and the like (Step S101). The W/E cycles is the number of times a write operation and an erase operation (representing the number of times of rewriting) are carried out, and is managed for each block BLK of the NAND flash memory 3. The W/E cycles is managed using a management table stored in the DRAM 4, and information therein is appropriately updated. The temperature is measured using the temperature sensor 6.

Subsequently, the memory controller 5 determines a boundary time Td on the basis of the stress conditions checked in Step S101 (Step S102). One example of the method for setting the boundary time Td will be described later.

Subsequently, the memory controller 5 selects a setting value table that is used for correcting a read voltage (Step S103). The setting value table includes a setting value table for a short term and a setting value table for a long term. Details of the setting value table will be described later.

Subsequently, the memory controller 5 monitors whether or not a read command has been received from the host device 1 (Step S104).

When a read command has been received in Step S104 (Step S104=Yes), the memory controller 5 calculates an elapsed time period from end of the programming until the time when the received read command is to be processed, in other words, "elapsed time period=current time−programming end time" (Step S105). Subsequently, the memory controller 5 determines whether or not the elapsed time calculated in Step S105 is the boundary time Td or shorter (Step S106).

Figure 9A:
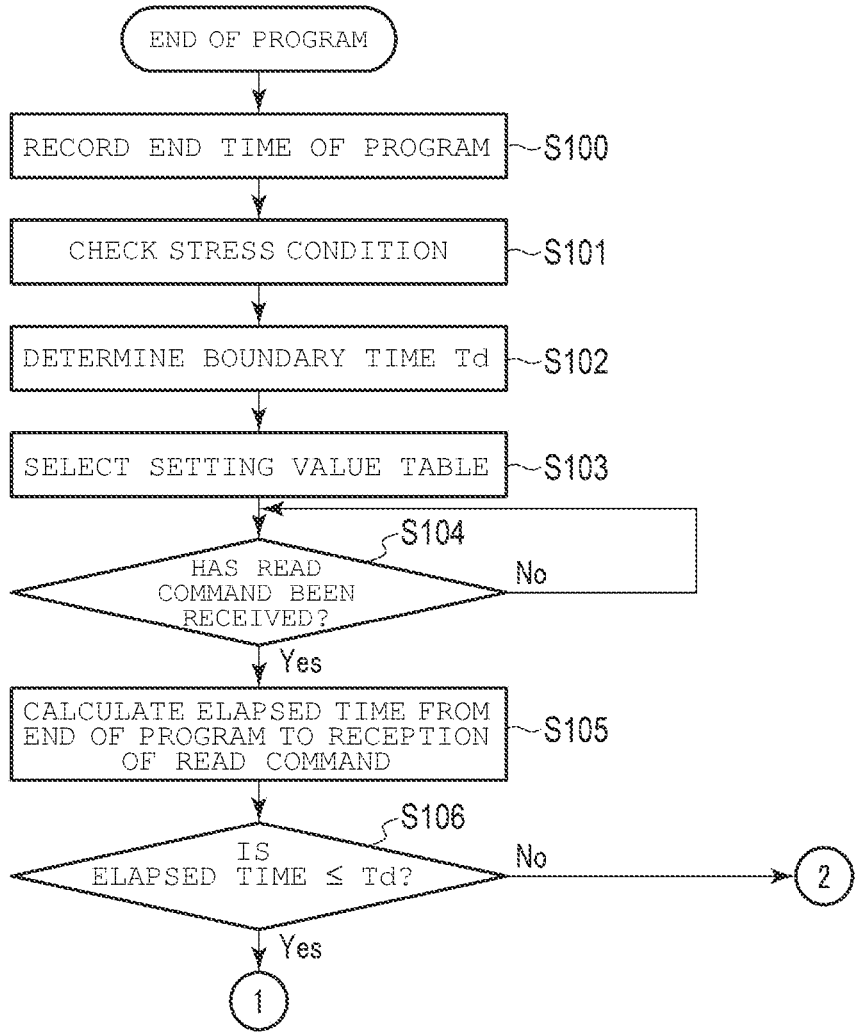
FIGS. 9A-9D depict a flowchart illustrating a read sequence of the memory system according to the first embodiment.
Figure 9B:
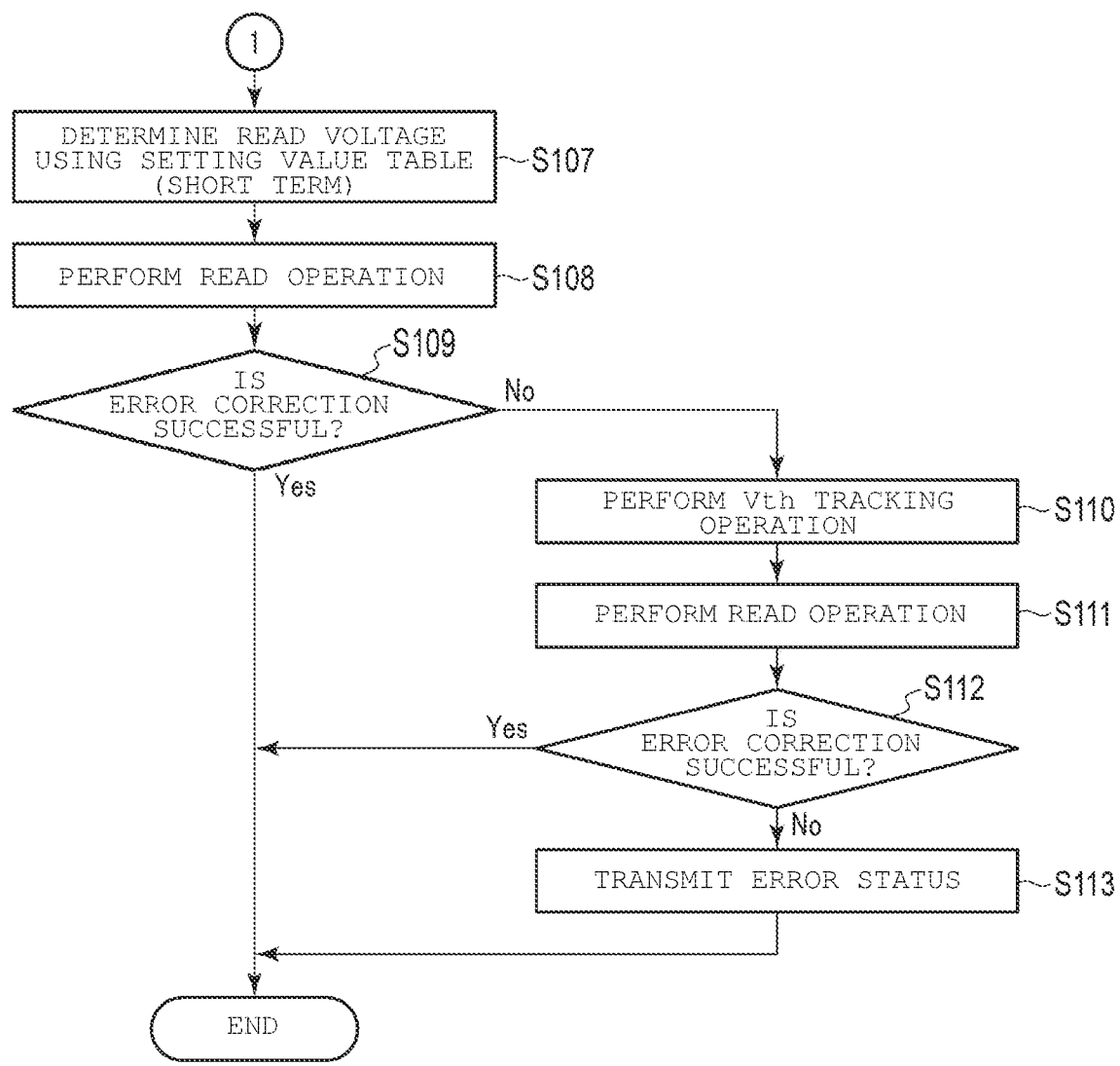

When the elapsed time is the boundary time Td or shorter in Step S106 (Step S106=Yes), the memory controller 5 executes a read sequence for the short term illustrated in FIG. 9B. In other words, the memory controller 5 determines a read voltage using the setting value table for the short term (Step S107). The memory controller 5 acquires a corresponding read voltage by referring to the setting value table selected in Step S103 on the basis of the calculated elapsed time. In a case in which the elapsed time is not included in a row of the setting value table, a row having the closest value is selected, or two rows having closest values are selected, and a read voltage is calculated, for example, by linear interpolation.

Subsequently, the memory controller 5 executes a read operation for the NAND flash memory 3 using the read voltage determined in Step S107 (Step S108). The read operation may include a process of adjusting a read voltage for the NAND flash memory 3 using a command. Details of the read operation will be described later.

Subsequently, in a case in which the number of error bits is larger than the number of correctable error bits of the ECC circuit 13 (Step S109=No), the correction fails, and, as a result thereof, a read error is determined. In a case in which the number of error bits is the number of correctable error bits of the ECC circuit 13 or less (Step 109=Yes), the correction is successful, and, as a result thereof, successful read is determined, and the memory controller 5 ends the read operation.

When the number of error bits is larger than the number of correctable error bits of the ECC circuit 13 (Step S109=No), the memory controller 5 executes another read method, for example, an operation for searching an optimal read voltage (Vth tracking operation) (Step S110). Subsequently, the memory controller 5 executes a read operation for the NAND flash memory 3 using the read voltage acquired in Step S110 (Step S111).

When data is successfully read in Step S111 (Step S112=Yes), the memory controller 5 ends the read operation. When data is not successfully read in Step S111 (Step S112=No), the memory controller 5 transmits an error status indicating that the read operation is not successfully performed to the host device 1 (Step S113).

Figure 9C:
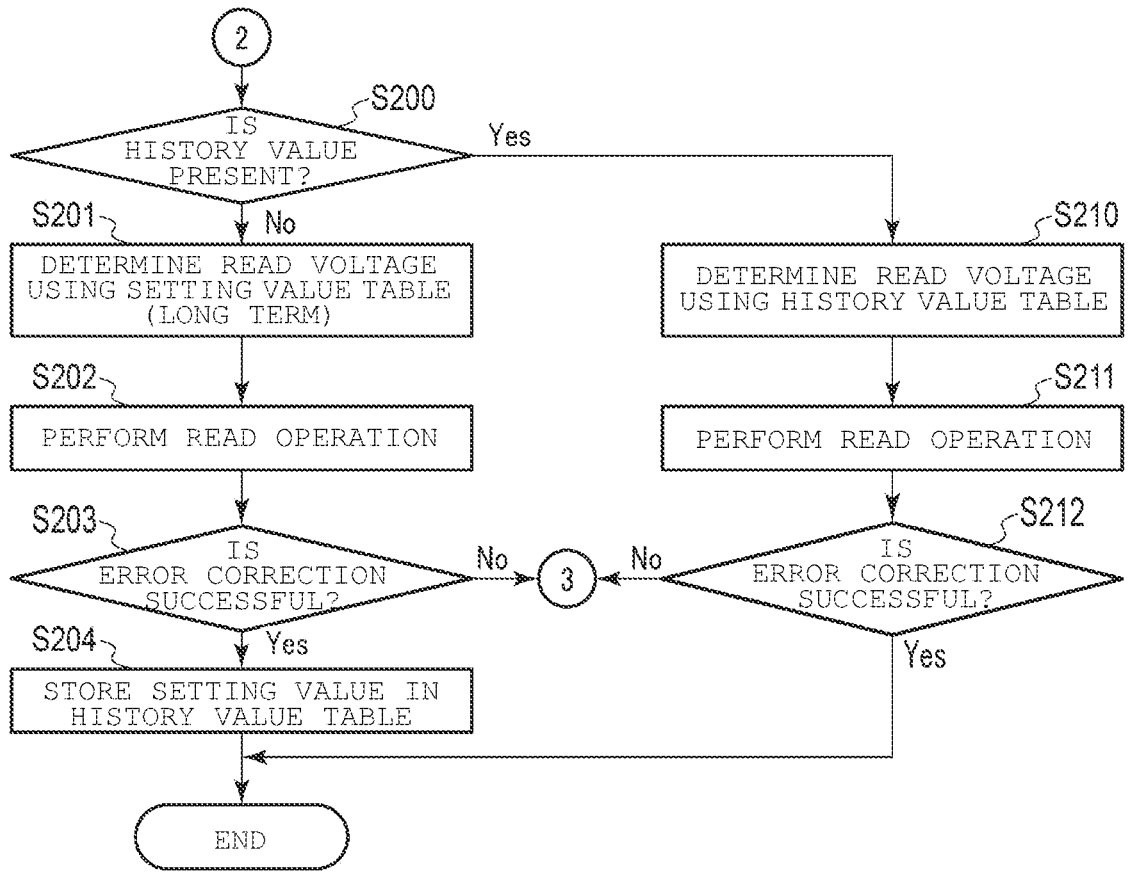

In Step S106, when the elapsed time exceeds the boundary time Td (Step S106=No), the memory controller 5 executes the read sequence for the long term illustrated in FIG. 9C. Specifically, the memory controller 5 determines whether or not a history value is present (Step S200). For example, the memory controller 5 manages a flag representing whether or not the history value is present. The flag is reset in a case in which the data of the block BLK is erased.

When a history value is not present in Step S200, in other words, in the case of a read operation of first time after the programming (Step S200=No), the memory controller 5 determines a read voltage using the setting value table for the long term (Step S201).

Subsequently, the memory controller 5 executes a read operation for the NAND flash memory 3 using the read voltage determined in Step S201 (Step S202).

Subsequently, when data is successfully read in Step S202 (Step S203=Yes), the memory controller 5 records the read voltage from the setting value table in a history value table (Step S204). The history value table is a table that is used for recording a read voltage used in a read operation. The history value is managed for each block BLK, each page, or a group of plural pages or plural word lines. Thereafter, the memory controller 5 ends the read operation.

On the other hand, when data is not normally read in Step S202 (Step S203=No), the memory controller 5, for example, executes a Vth tracking operation (Step S205). Subsequently, the memory controller 5 executes a read operation for the NAND flash memory 3 using the read voltage acquired in Step S205 (Step S206).

When data is successfully read in Step S206 (Step S207=Yes), the memory controller 5 updates the history value table (Step S208). In other words, the memory controller 5 updates an entry for the block in the history value table with the read voltage used at the time of successfully reading the data. Thereafter, the memory controller 5 ends the read operation.

On the other hand, when data is not successfully read in Step S206 (Step S207=No), the memory controller 5 transmits an error status indicating that the read operation is not successfully performed to the host device 1 (Step S209).

In Step S200, when a history value is present (Step S200=Yes), the memory controller 5 acquires a read voltage from an entry for a block including a read target address by referring to the history value table and determines the read voltage (Step S210).

Subsequently, the memory controller 5 executes a read operation for the NAND flash memory 3 using the read voltage determined in Step S210 (Step S211).

Subsequently, when data is successfully read in step S211 (Step S212=Yes), the memory controller 5 ends the read operation.

On the other hand, when data is not successfully read in Step S211 (Step S212=No), the memory controller 5 proceeds to Step S205. The operations of Step S205 and subsequent operations are as described above.

1-2-3 Boundary Time Td Setting Method

Next, a setting method of the boundary time Td relating to Steps S101 and S102 described above will be described. In accordance with stress conditions such as a temperature, a write/erase cycle (W/E), and the like, there is a possibility that the characteristics of memory cells (e.g., data storing characteristics and the like) change, and there is a possibility that an optimal read voltage changes. Thus, in this embodiment, the boundary time Td is set to be optimal in accordance with the stress conditions.

FIG. 10 is a diagram illustrating one example of a boundary time Td table. The boundary time Td table stores a correspondence relationship between a plurality of stress conditions # i and plurality of boundary time periods Td_i. Here, "i" is an integer of one or more. For example, Stress condition #1 is a temperature of 10 degrees (° C.) and a number of write/erase cycles (W/E)=1000 cycles (1 k), Stress condition #2 is a temperature of 10 degrees and W/E=2 k cycles, and Stress condition # M is a temperature of 80 degrees and W/E=15000 cycles (15 k). In Stress condition #1, Stress condition #2, and Stress condition # M, boundary time periods Td_1, Td_2, and Td_M are respectively selected. FIG. 10 illustrates reference values of stress conditions as an example and, for example, the boundary time Td_1 may be selected in a case in which the temperature and W/E are the reference values of Stress condition #1 or less, and the boundary time Td_2 may be selected in a case in which the temperature and W/E are larger than the reference values of Stress condition #1 and the reference values of Stress condition #2 or less.

For example, during the design the memory system 2, the boundary time Td is calculated for each of plural stress conditions. The results of the calculations are stored in the NAND flash memory 3 in a nonvolatile manner as the boundary time Td table. Then, upon a boot time of the memory system, the boundary time Td table is read into the DRAM 4. For example, the boundary time Td table is determined when the memory system is designed and is not rewritten thereafter. Alternatively, a boundary time may be dynamically measured during the operation of the memory system, and the boundary time Td may be updated.

1-2-4 Read Voltage Correction Method

Next, the read voltage correction method will be described. In this embodiment, a boundary time Td between a short term and a long term is defined, and it is determined whether an elapsed time after the programming is in the short term or the long term. Then, a read voltage is corrected using different methods for the short term and the long term. For this reason, a setting value table in which read voltages for the short term and read voltages for the long term are divided is used.

FIG. 11 is a schematic diagram illustrating one example of a relationship between a plurality of read voltages and a plurality of elapsed time periods from the end of programming to the time when the received read command is to be processed, stored in the setting value table. In FIG. 11, the horizontal axis represents the elapsed time t, and the vertical axis represents an optimal read voltage applied to a word line of the read target during the read operation. In general, an optimal read voltage immediately after the programming (t=0) is represented as L0, and an optimal read voltage at the boundary time Td is represented as Ld. For the other states, a read voltage is similarly defined.

As described above, within the short term, a threshold voltage of a memory cell shifts down significantly in accordance with an elapsed time. Thus, within the short term, a plurality of read voltages (voltages corresponding to white circles illustrated in FIG. 11) are prepared in correspondence with plural elapsed time periods.

FIG. 12 is a diagram illustrating one example of the setting value table. A setting value table is prepared for each of the stress conditions. " . . . " illustrated in FIG. 12 represents a read voltage.

For example, in Stress condition #1, the boundary time Td=25 (s). In addition, an optimal read voltage is set for each of elapsed time periods t=0, 5, 10, 15, 20, and 25. The optimal read voltage is set for each of states "A" to "G". More specifically, the read voltage increases in order of the states "A" to "G". In addition, the read voltage decreases in order of the elapsed time periods t=0, 5, 10, 15, 20, and 25.

An optimal read voltage in the long term is set to an average value of optimal read voltages at appropriate time from the boundary time Td (a heuristic value).

Since an optimal read voltage changes in accordance with stress conditions such as a temperature, the W/E cycles, and the like, during the design stage, setting values in all the stress conditions are checked, and the setting values are stored in the setting value table. The setting value table is stored in the NAND flash memory 3 in a nonvolatile manner. Then, upon a boot time of the memory system, the setting value table is read into the DRAM 4. For example, the values of the setting value table are determined when the memory system is designed, and thereafter are not rewritten. Alternatively, the setting values may be dynamically measured during the operation of the memory system, and the setting value table may be updated.

1-2-5 Example of History Value Table

Next, one example of the history value table will be described. FIG. 13 is a diagram illustrating one example of the history value table.

The history value table is a table used for storing read voltages used when reading is successfully performed as history values. The history value table stores history read voltages for the long term. A history read voltage is managed for each block BLK. The history read voltage may be managed in units other than blocks BLK, for example, in units of pages or in units of groups of plural pages or plural word lines. History read voltages are set for the states "A" to "G". In FIG. 13, as one example, history values of a block BLK0 (block #0) to a block BLK2500 (block #2500) are illustrated.

The history value table is used for a read operation carried out in the long term. In a case in which reading is successful, the history value table is updated with a read voltage used in the read operation of this time. Accordingly, a read voltage that is used first in a read operation (i.e., not in the retry read operations) of this time is the same as a read voltage used in a successful read operation of the previous time within the long term. Accordingly, even in a case in which the threshold voltage of the memory cell changes (for example, down shifts) in accordance with elapse of time, a read operation can be performed using a more optimal read voltage. The history value table is stored in the DRAM 4. The history value table may be stored in the NAND flash memory 3 in a nonvolatile manner. Then, upon a boot time of the memory system, the history value table may be read into the DRAM 4.

Figure 14:
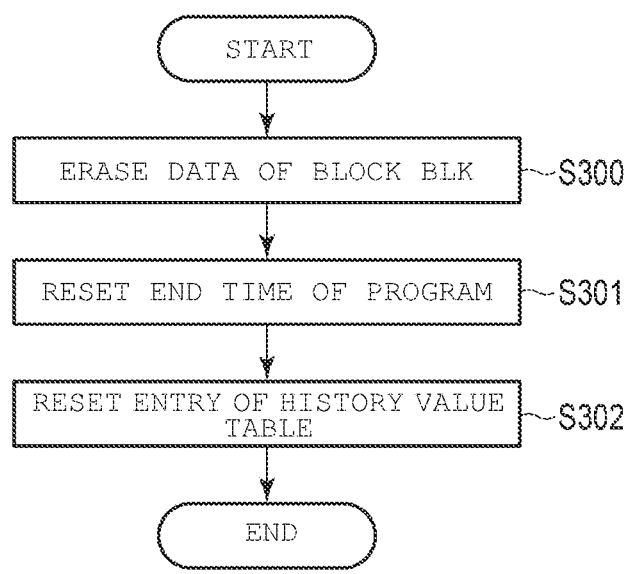
FIG. 14 is a flowchart illustrating an operation of the history value table.

Next, a management operation of the history value table will be described. FIG. 14 is a flowchart illustrating the management operation of a history value table.

The memory controller 5 erases data of a certain block BLK, for example, in response to an erase command from the host device 1 or in accordance with an internal process (garbage collection or the like) (Step S300). Subsequently, the memory controller 5 resets the end time of the program recorded in Step S100 described above (Step S301). Subsequently, the memory controller 5 resets the data of the history value table (Step S302). More specifically, the memory controller 5 resets a history value of an entry corresponding to the block in the history value table and resets a flag, which indicates whether or not the history value described above is present, to a state in which a history value is not present.

In this way, in this embodiment, as one example, every time when the data of the block BLK is erased, a history value of an entry corresponding to the block in the history value table is also reset.

1-2-6 Read Voltage Setting Operation

Figure 15:
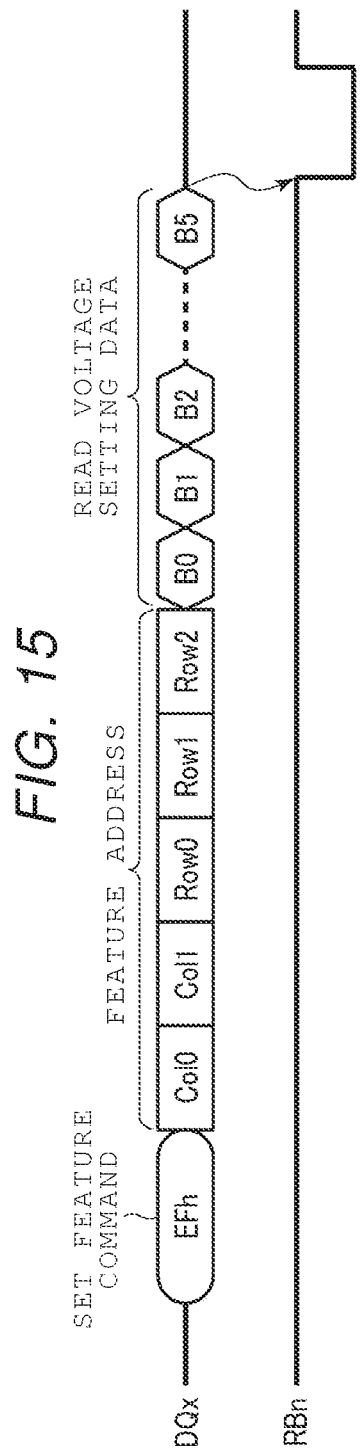
FIG. 15 is a command sequence diagram illustrating a read voltage setting operation in the memory system.

Next, a read voltage setting operation included in a read operation will be described. FIG. 15 is a command sequence diagram illustrating a read voltage setting operation in the memory system 2.

The memory controller 5 transmits data to the NAND flash memory 3 via signal lines DQx (for example, DQ0 to DQ7). The memory controller 5 sets a read voltage in the NAND flash memory 3 using a set feature command "EFh". Here, "h" represents a hexadecimal number. The set feature command "EFh" is a command that changes parameters such as various voltages, operation timings, and the like in the NAND flash memory 3.

The memory controller 5 transmits a command sequence "<EFh><Col0><Col1><Row0><Row1><Row2><B0> to <B5>" to the NAND flash memory 3. Address "<Col0><Col1><Row0><Row1><Row2>" is a feature address and designates a storage area in which information of read voltages is to be stored. The feature address, for example, includes column addresses Col and row addresses Row. Data "<B0> to <B5>" is setting data for a read voltage.

When a command sequence is received from the memory controller 5, the NAND flash memory 3 sets the ready/busy signal RBn to a low level, indicating a busy state. Then, the NAND flash memory 3 overwrites the read voltage using the setting data for a read voltage. The storage area of information relating to a read voltage, for example, is included in the register 23. Then, the NAND flash memory 3 sets the ready/busy signal RBn to a high level, indicating a ready state.

In this way, the memory controller 5 appropriately sets a read voltage used in the NAND flash memory 3.

1-2-7 Read Operation

Figure 16:
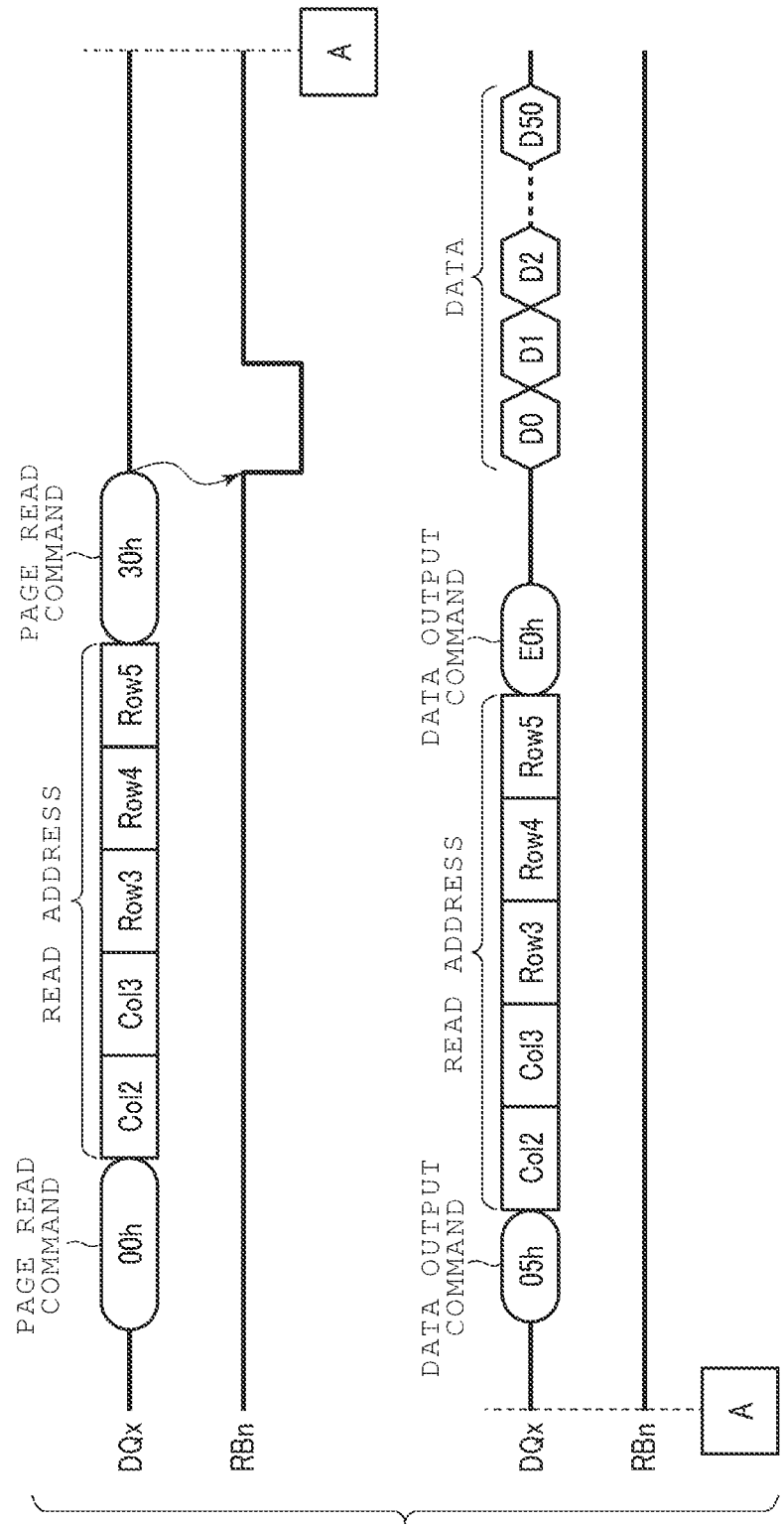
FIG. 16 is a command sequence diagram illustrating a read operation of the memory system.

Next, a read operation of the memory system 2 will be described. FIG. 16 is a command sequence diagram illustrating a read operation of the memory system 2.

The memory controller 5 reads data from the NAND flash memory 3 using a page read command "00h" and "30h". The page read command "00h" and "30h" is a command directing to read data from, for example, a page. The memory controller 5 transmits a command sequence "<00h><Col2><Col3><Row3><Row4><Row5><30h>" to the NAND flash memory 3. Here, the address "<Col2><Col3><Row3><Row4><Row5>" is a read target address.

When a page read command "30h" is received from the memory controller 5, the NAND flash memory 3 sets the ready/busy signal RBn to the low level, indicating the busy state. Then, the NAND flash memory 3 reads data from a corresponding page in the memory cell array 20 using the read target address. The page data read from the memory cell array 20 is stored in the data register 29. When the reading of the data ends, the NAND flash memory 3 sets the ready/busy signal RBn to a high level, indicating the ready state.

Subsequently, the memory controller 5 outputs data from the NAND flash memory 3 using a data output command "05h" and "E0h". The data output command "05h" and "E0h" is a command directing to output data. The memory controller 5 transmits a command sequence "<05h><Col2><Col3><Row3><Row4><Row5><E0h>" to the NAND flash memory 3.

The NAND flash memory 3 outputs data stored in the data register 29 to the memory controller 5 in response to the data output command.

In this way, the memory controller 5 reads data from the NAND flash memory 3.

In a read operation, for example, a preset read voltage that is determined in advance is used. In addition, the read voltage set in the sequence illustrated in FIG. 15 described above may be used. In addition, retry read operation in which reading is performed again with a read voltage changed may be performed. In the retry read operation, a read voltage may be set using the sequence illustrated in FIG. 15 described above.

1-2-8 Vth Tracking Operation

Next, the Vth tracking operation relating to Steps S110 and S205 described above will be described.

In order to minimize the number of error bits at the time of reading data, it is preferable to perform a retry read operation using a voltage of a valley position at which overlapping between threshold voltage distributions of neighboring two levels is minimum. The Vth tracking operation is an operation for searching for an optimal read voltage.

FIGS. 17A to 17C are schematic diagrams illustrating the Vth tracking operation. In FIGS. 17A to 17C, as an example, only threshold voltage distributions of a state "A" and a state "B" are illustrated. FIG. 17A is a graph illustrating the threshold voltage distributions of the state "A" and the state "B". FIG. 17B is a graph illustrating a transition of the number of memory cells that are in an ON state (i.e., the number of On-cells) with respect to a read voltage. FIG. 17C is a histogram illustrating the amount of change in the number of On-cells in the range of a read voltage. FIGS. 17B and 17C are plotted in correspondence with a memory cell transistor MT group having the threshold voltage distribution illustrated in FIG. 17A.

As illustrated in FIG. 17B, when the read voltage is increased, the number of On-cells rapidly increases at a voltage that is slightly lower than a voltage CA that is a median value of the state "A", and dM/dV becomes a maximum. Here, the median value is a voltage having a highest distribution probability of the threshold voltage in FIG. 17A. M is the number of On-cells, and V is a read voltage applied to a selected word line WL. When the read voltage is further increased, an increase rate of the number of On-cells decreases and becomes a minimum at a certain value. The increase rate at this read voltage becomes zero in a case in which the threshold voltage distribution of the state "A" and the threshold voltage distribution of the state "B" do not overlap each other. On the other hand, in a case in which the threshold voltage distributions overlap each other, the increase rate does not become zero, but a minimum value (>0). On the other hand, when the read voltage is further increased, the increase rate of the number of On-cells increases again, and dM/dV becomes a maximum again at a voltage that is slightly lower than the voltage CB that is the median value of the state "B".

In accordance with a change in the accumulated value of the number of On-cells described above, a valley position between two states, in other words, the position of a read voltage at which overlapping between the threshold voltage distributions of two states is smallest is detected. For example, first, a read operation is performed using a read voltage V1. The number of On-cells at this time will be denoted by M1. Next, a read operation is performed using a voltage V2 that is higher than the voltage V1 by ΔV. The number of On-cells at this time will be denoted by M2. Then, the number of memory cell transistors MT that are caused to be in the ON state when the voltage of the selected word line WL rises from the voltage V1 to the voltage V2 is (M2−M1).

Subsequently, a read operation is performed using a voltage V3 that is higher than the voltage V2 by ΔV. The number of On-cells at this time will be denoted by M3. Then, the number of memory cell transistors MT that are caused to be in the ON state when the voltage of the selected word line WL rises from the voltage V2 to the voltage V3 is (M3−M2). When "(M2−M1)>(M3−M2)", a voltage of which "dM/dV" becomes a minimum is estimated to be at least higher than the voltage V2.

Subsequently, a read operation is performed using a voltage V4 that is higher than the voltage V3 by ΔV. When the number of On-cells is M4, and "(M3−M2)<(M4−M3)", a histogram as illustrated in FIG. 17C is acquired.

In accordance with the result described above, a threshold voltage distribution as denoted by a dashed line illustrated in FIG. 17C is estimated using the amount of change in the number of On-cells, and a valley position between the state "A" and the state "B" is estimated to be positioned between the voltage V2 and the voltage V3. Thereafter, a read operation is performed using a read voltage corresponding to the estimated valley position. While a tracking operation can accurately estimate an optimal read voltage on the basis of an actual threshold voltage distribution, the read performance may be easily degraded since the tracking operation requires a large number of times of reading is performed to determine the optimal read voltage.

1-3 Effect of First Embodiment

As described above in detail, in the first embodiment, the memory system 2 includes: the NAND flash memory 3 including the memory cell array 20 storing data; and the memory controller 5 reading data from the NAND flash memory 3 by controlling the operation of the NAND flash memory 3. The memory controller 5 determines a read voltage used for reading data from the NAND flash memory 3 by dividing a period into the short term starting immediately after the end of a write operation and the long term following the short term. The memory controller 5 changes a read voltage in accordance with an elapsed time in a read operation of the short term and determines a read voltage regardless of an elapsed time in a read operation of the long term.

For example, in a comparative example only with a history value, by using a fixed value in a period in which there is no history value, a read operation of the first time is performed with a read voltage deviating from an optimal one, and there is a high probability of being unsuccessful in the read operation of the first time. In addition, a history value within the short term after a successful retry read operation is recorded. Since a change in an optimal read voltage is large within the short term, when data is read using a history value, the probability of deviating from an optimal read voltage is high.

In addition, within the short term, in another comparative example using a constant read voltage regardless of the elapsed time, within the short term in which a change in the optimal read voltage is large, a read operation is performed using a certain constant voltage that deviates from an optimal read voltage.

Meanwhile, according to the first embodiment, a read operation can be performed using an optimal read voltage. Accordingly, the read performance of the memory system 2 can be improved. In addition, in the example in which retry read operation is performed in a read operation, the number of times of retry read operations performed can be decreased.

In addition, a setting value table storing information representing a correspondence relation between a plurality of elapsed time periods and a plurality of read voltages in the short term is provided. Accordingly, selection of an optimal read voltage can be performed in a speedy manner.

In addition, the setting value table stores one read voltage for each state for the long term. Accordingly, also in the long term, a read operation can be performed using an optimal read voltage.

In addition, the history value table used for storing a read voltage used in the read operation as a history value is provided. In a read operation of the second time and subsequent read operations within the long term, a read operation is performed using a read voltage stored in the history value table. Accordingly, in the read operation of the second time and subsequent read operations in the long term, a read voltage that is close to an optimal read voltage can be used. On the other hand, within the short term, an optimal read voltage greatly changes in a short time, and accordingly, there is a low possibility that data can be read next time using a read voltage that is successful in the previous time. For this reason, within the short term, a history value is not recorded for later use.

In addition, a boundary time Td between the short term and the long term is changed in accordance with stress conditions such as a temperature, the W/E cycles, and the like. Furthermore, a read voltage is changed in each of the short term and the long term in accordance with stress conditions such as a temperature, the W/E cycles, and the like.

2 Second Embodiment

Figure 18A:
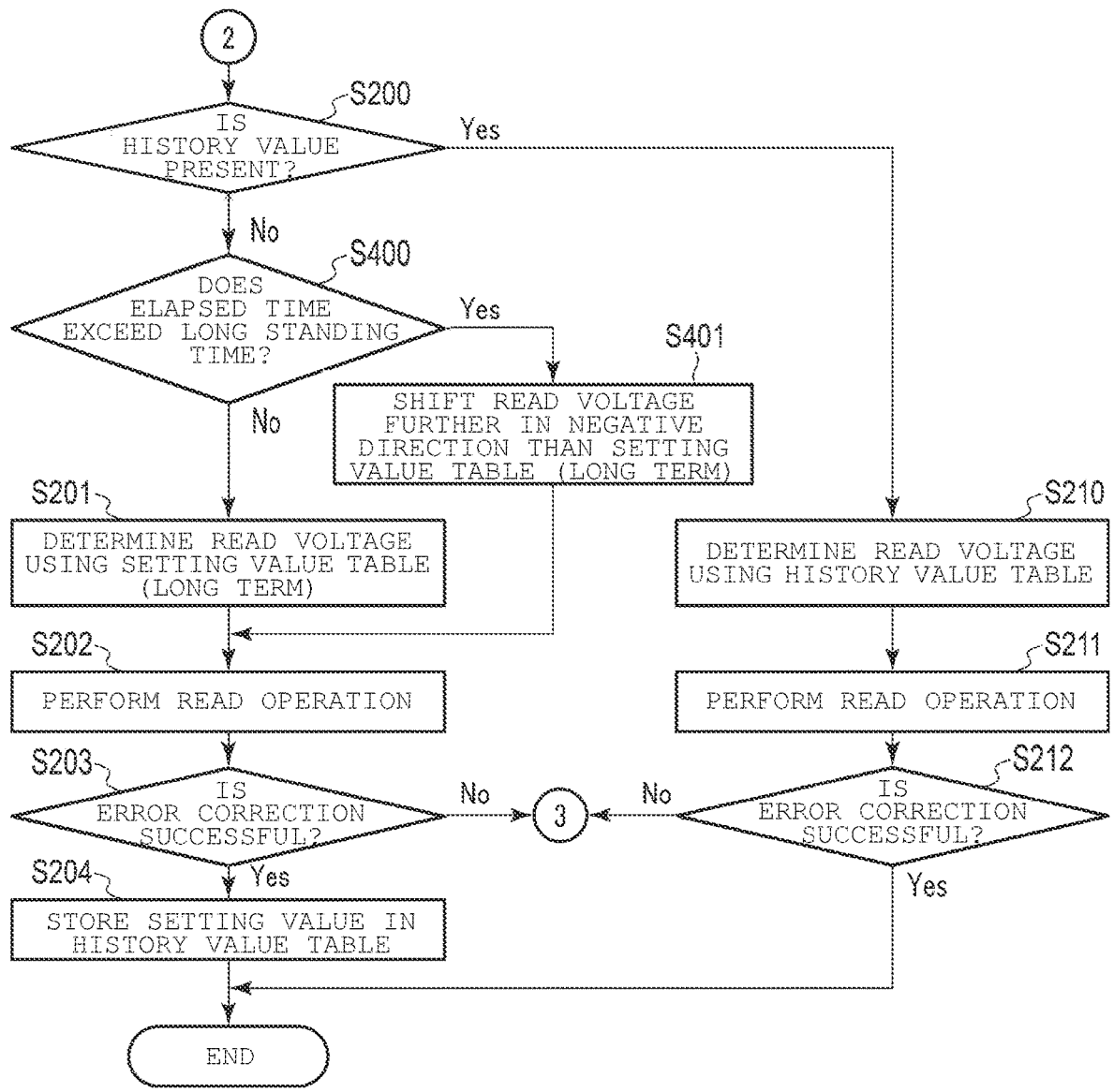
FIGS. 18A-18B depict a flowchart illustrating a read sequence of a memory system according to a second embodiment.
Figure 18B:
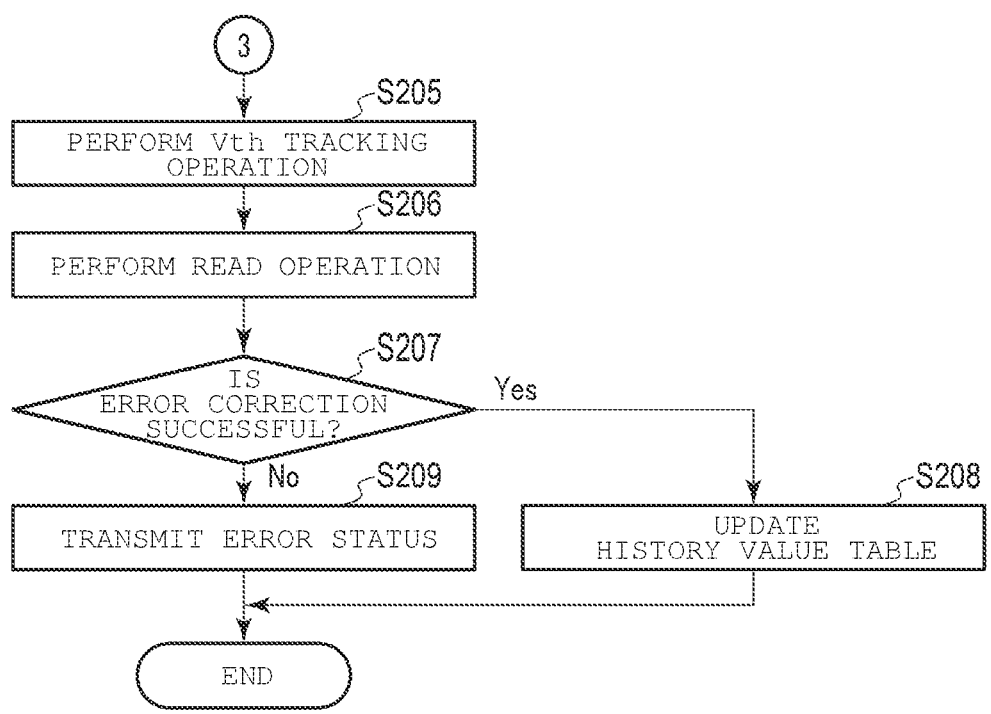

FIGS. 18A and 18B are flowcharts illustrating a read sequence of a memory system 2 according to a second embodiment. FIGS. 18A and 18B illustrate operations of Step S200 and subsequent steps. Steps before Step S200, in other words, the operations of Steps S100 to S114 illustrated in FIGS. 9A and 9B are the same as those of the first embodiment, and thus, FIGS. 9A and 9B are quoted.

Figure 9D:
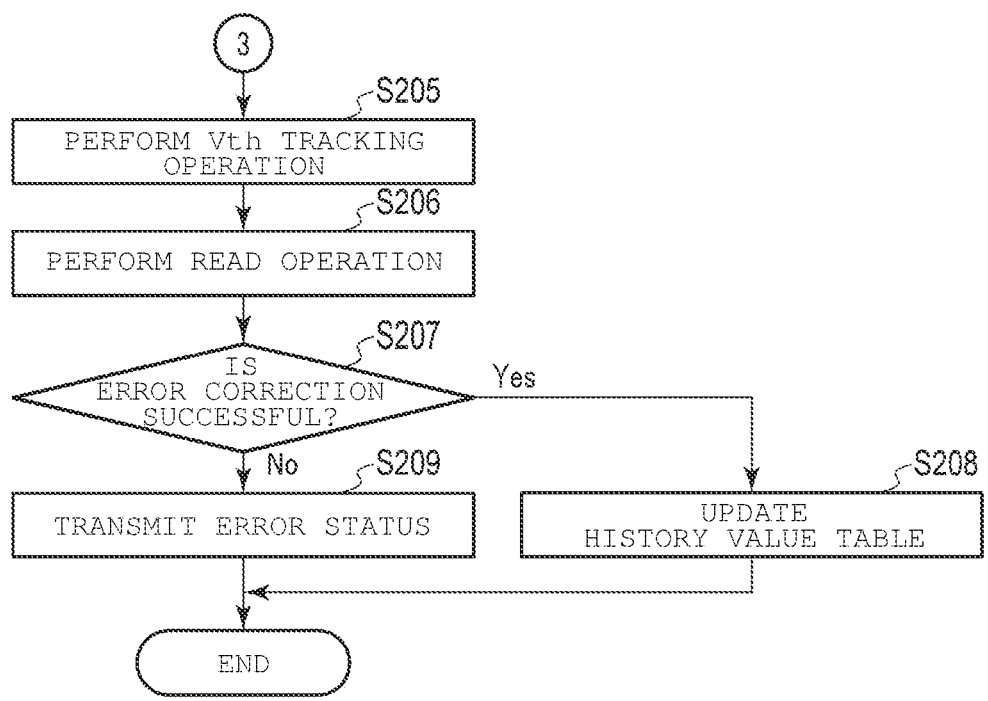

As illustrated in FIGS. 18A and 18B, a difference between the second embodiment and the first embodiment is in that Steps S400 and S401, which are newly added to the flowcharts illustrated in FIGS. 9C and 9D described in the first embodiment.

In the second embodiment, a long standing time longer than the long term is newly defined. The long standing time is a time that is sufficiently longer than the short term and the long term and, for example, is a period of one day or the like.

When a history value is not present in Step S200 (Step S200=No), the memory controller 5 determines whether or not an elapsed time exceeds the long standing time (Step S400).

In Step S400, when the elapsed time exceeds the long standing time (Step S400=Yes), the memory controller 5 uses the setting value table for the long term and sets a new read voltage acquired by shifting the read voltage acquired from the setting value table in the negative direction by a predetermined voltage (Step S401). The amount of shift of the voltage in Step S401 may be determined in any manner in accordance with the characteristics of the memory cell transistor MT.

When the elapsed time exceeds the long standing time, the threshold voltage distribution shifts down in accordance with the influence of data retention characteristics. A read voltage is shifted further in the negative direction than the setting value table for the long term in accordance therewith.

On the other hand, in Step S400, when the elapsed time does not exceed the long standing time (Step S400=No), the memory controller 5 determines a read voltage using the setting value table for the long term (Step S201). Operations performed thereafter are the same as those according to the first embodiment.

According to the second embodiment, when the elapsed time exceeds the long standing time, the number of times of retry read operations performed can be decreased. Accordingly, a time required for a read operation (read time) can be shortened.

3 Other Modified Examples

The short term is a relatively short time, and it is assumed that there is little amount of the threshold voltage shift due to a read disturbance stress. Accordingly, within the short term, a read voltage does not need to be compensated for the read disturbance stress.

In the embodiment described above, while a case in which one memory cell transistor stores data of three bits is described as an example, the data is not limited to three bits. For example, one memory cell transistor may be configured to store data of two bits (multi-level cell (MLC)) or data of four bits or more. Also in such an example, various operations described in the embodiments described above can be realized.

In the embodiments described above, the NAND flash memory including plural memory cells that are three-dimensionally stacked is described as an example. However, the NAND flash memory is not limited thereto, and a NAND flash memory including plural memory cells that are arranged in two dimensions may be used.

In the embodiments described above, while a case in which a MONOS film is used for the memory cell is described as an example, the present disclosure is not limited thereto. For example, a memory cell of a floating-gate type may be used.

In description here, a "connection" represents an electric connection, and, for example, a case in which another element is interposed between two connected elements is not excluded.

While preferred embodiments of the present disclosure have been described and illustrated above, it should be understood that these are mere examples and are not to be considered as limiting. Additions, omissions, substitutions, and other modifications can be made without departing from the spirit or scope of the present disclosure. Accordingly, the present disclosure is not to be considered as being limited by the foregoing description, and is only limited by the scope of the appended claims.

What is claimed is:

1. A memory system comprising:
    a nonvolatile semiconductor memory including memory cells for storing data; and
    a controller configured to control a read operation of the nonvolatile semiconductor memory to read data from the nonvolatile semiconductor memory, wherein the controller is configured to:
    determine a read voltage to be used for reading data from the nonvolatile semiconductor memory depending on whether the read operation is performed during a first period after an end of a write operation of the data or during a second period following the first period,
    upon determining that the read operation is performed during the first period, change the read voltage in accordance with an elapsed time period after the end of the write operation of the data, and
    upon determining that the read operation is performed during the second period, determine the read voltage regardless of the elapsed time period after the end of the write operation of the data.

2. The memory system according to claim 1, wherein
a rate at which a threshold voltage of the memory cells decreases is higher in the first period than in the second period.

3. The memory system according to claim 2, further comprising:
a first memory storing a first table, wherein
the first table includes a first area storing a plurality of read voltages for read operations to be performed during the first period,
the first area stores information representing a correspondence relationship between a plurality of elapsed time periods and the plurality of read voltages, and
the controller determines the read voltage for a read operation to be performed during the first period using the first area of the first table.

4. The memory system according to claim 3, wherein
the first table further includes a second area storing one read voltage for read operations performed during the second period, and
the controller determines a read voltage for a read operation to be performed during the second period using the second area of the first table.

5. The memory system according to claim 4, wherein
the first table corresponds to a first number of write/erase cycles performed on the memory cells,
the first memory further stores a second table which corresponds to a second number of write/erase cycles performed on the memory cells, which is greater than the first number of cycles, the second table including a first area storing a plurality of read voltages for read operations to be performed during the first period and a second area storing one read voltage for read operations to be performed during the second period, and
the controller determines the read voltage using the first table if an actual number of write/erase cycles performed on the memory cells is less than the first number of cycles, and determines the read voltage using the second table if the actual number of write/erase cycles is greater than the first number of cycles and less than the second number of cycles.

6. The memory system according to claim 4, wherein
the first table corresponds to a first temperature,
the first memory further stores a second table which corresponds to a second temperature, which is higher than the first temperature, the second table including a first area storing a plurality of read voltages for read operations to be performed during the first period and a second area storing one read voltage for read operations to be performed during the second period, and
the controller determines the read voltage using the first table if the current temperature is lower than the first temperature, and determines the read voltage using the second table if the current temperature is higher than the first temperature and lower than the second temperature.

7. The memory system according to claim 3, wherein
the first memory further stores a history table, which stores a read voltage with which a previous read operation performed during the second period has resulted in a successful error correction, and
the controller uses the history table in a subsequent read operation performed during the second period.

8. The memory system according to claim 7, wherein a target block for the subsequent read operation is the same as a target block for the previous successful read operation, and the target block is not erased between the previous successful read operation and the subsequent read operation.

9. The memory system according to claim 8, wherein
the history table is not updated upon a previous successful read operation carried out during the first period.

10. The memory system according to claim 1, wherein
the controller is configured to change a boundary time between the first period and the second period in accordance with the number of write/erase cycles performed on the memory cells.

11. The memory system according to claim 1, wherein
the controller is configured to change a boundary time between the first period and the second period in accordance with a temperature.

12. The memory system according to claim 1, wherein
the controller is configured to transmit to the nonvolatile semiconductor memory a first command used for setting the read voltage in the nonvolatile semiconductor memory, and
the nonvolatile semiconductor memory changes the read voltage in response to the first command.

13. The memory system according to claim 1, further comprising:
a timer configured to measure the elapsed time, wherein
the controller determines whether the read operation is during the first period or the second period using a measurement result of the timer.

14. The memory system according to claim 1, wherein
the memory cell is in one of a plurality of states relating to a threshold voltage, and
the read voltage is set for each of the plurality of states relating to the threshold voltage.

15. A method of performing a read operation on a nonvolatile memory cell after the nonvolatile memory cell is written at a first point in time, said method comprising:
in response to a read request for data stored in the nonvolatile memory cell after the first point in time, determining a length of elapsed time since the first point in time, determining whether the length of elapsed time is shorter than a threshold length or longer than the threshold length;
upon determining that the length of elapsed time is shorter than the threshold length, performing the read operation using a first read voltage, which is determined according to the length of elapsed time; and
upon determining that the length of elapsed time is longer than the threshold length, performing the read operation using a second read voltage, which is not dependent on the length of elapsed time.

16. The method according to claim 15, wherein the second read voltage is determined from a read voltage that is previously used in a successful read operation.

17. The method according to claim 15, further comprising:
adjusting the threshold length on the basis of a number of write/erase cycles performed on the nonvolatile memory cell.

18. The method according to claim 15, further comprising:
adjusting the threshold length on the basis of a current temperature.

19. The method according to claim 15, further comprising:
determining the first read voltage from a plurality of read voltages using a table that stores information representing a correspondence relationship between a plurality of elapsed time periods and the plurality of read voltages.

20. The method according to claim 19, further comprising:
   selecting the table from a plurality of tables each of which stores information representing a correspondence relationship between a plurality of the elapsed time periods and the plurality of read voltages, on the basis of a number of write/erase cycles performed on the non-volatile memory cell and a current temperature.

* * * * *